United States Patent
Park et al.

(10) Patent No.: US 11,387,413 B2
(45) Date of Patent: Jul. 12, 2022

(54) POLYMER, ORGANIC SOLAR CELL COMPRISING POLYMER, PEROVSKITE SOLAR CELL COMPRISING POLYMER

(71) Applicants: SEOUL NATIONAL UNIVERSITY R&DB FOUNDATION, Seoul (KR); GLOBAL FRONTIER CENTER FOR MULTISCALE ENERGY SYSTEMS, Seoul (KR)

(72) Inventors: Soo Young Park, Seoul (KR); Won Sik Yoon, Seoul (KR); Dong Won Kim, Gyeongsangnam-do (KR); Jun Mo Park, Seoul (KR)

(73) Assignees: SEOUL NATIONAL UNIVERSITY R&DB FOUNDATION, Seoul (KR); GLOBAL FRONTIER CENTER FOR MULTISCALE ENERGY SYSTEMS, Seoul (KR)

( * ) Notice: Subject to any disclaimer, the term of this patent is extended or adjusted under 35 U.S.C. 154(b) by 0 days.

(21) Appl. No.: 16/492,655

(22) PCT Filed: Mar. 9, 2018

(86) PCT No.: PCT/KR2018/002820
§ 371 (c)(1),
(2) Date: Jan. 10, 2020

(87) PCT Pub. No.: WO2018/169256
PCT Pub. Date: Sep. 20, 2018

(65) Prior Publication Data
US 2020/0243770 A1    Jul. 30, 2020

(30) Foreign Application Priority Data

Mar. 16, 2017  (KR) .................... 10-2017-0033259
Feb. 19, 2018  (KR) .................... 10-2018-0019512
Mar. 9, 2018   (KR) .................... 10-2018-0027796

(51) Int. Cl.
*H01L 51/00*    (2006.01)
*C08G 61/12*    (2006.01)
(Continued)

(52) U.S. Cl.
CPC ........ *H01L 51/0036* (2013.01); *C08G 61/126* (2013.01); *H01L 51/0043* (2013.01);
(Continued)

(58) Field of Classification Search
CPC ............ H01L 51/0036; H01L 51/0043; H01L 51/4213; H01L 51/4253; H01L 51/442;
(Continued)

(56) References Cited

U.S. PATENT DOCUMENTS

2015/0144846 A1* 5/2015 Nanson ................. C07F 7/2208
                                                        252/500
2017/0125172 A1* 5/2017 Gong .................. H01L 51/0047
(Continued)

FOREIGN PATENT DOCUMENTS

KR    1020140007045    1/2014
KR    1020140018349    2/2014
(Continued)

OTHER PUBLICATIONS

Yoon, "Synthesis, Property, and Optoelectronic Device Application of Bis-Lactam-Based Organic Semiconducting Materials" A Thesis Submitted in Partial Fulfillment of the Requirements for the Degree of Doctor of Philosophy in Engineering at the Graduate School of Seoul NationalUniversity, Aug. 2017.
(Continued)

*Primary Examiner* — Devina Pillay
(74) *Attorney, Agent, or Firm* — Stuart H. Mayer; Mayer & Williams PC

(57) ABSTRACT

The present invention relates to a polymer, an organic solar cell comprising the polymer, and a perovskite solar cell
(Continued)

comprising the polymer. The polymer according to the present invention has excellent absorption ability for visible light and an energy level suitable for the use as an electron donor compound in a photo-active layer of the organic solar cell, thereby increasing the light conversion efficiency of the organic solar cell. In addition, the polymer according to the present invention has high hole mobility, and is used as a compound for a hole transport layer, and thus can improve efficiency and service life of the perovskite solar cell without an additive.

4 Claims, 15 Drawing Sheets

(51) Int. Cl.
  *H01L 51/42* (2006.01)
  *H01L 51/44* (2006.01)
  *H01G 9/20* (2006.01)
(52) U.S. Cl.
  CPC . *C08G 2261/12* (2013.01); *C08G 2261/1412* (2013.01); *C08G 2261/3223* (2013.01); *C08G 2261/3241* (2013.01); *C08G 2261/91* (2013.01); *H01G 9/204* (2013.01); *H01G 9/2027* (2013.01); *H01G 9/2031* (2013.01); *H01L 51/4213* (2013.01); *H01L 51/4253* (2013.01); *H01L 51/442* (2013.01)
(58) Field of Classification Search
  CPC .. H01L 51/0047; H01G 9/204; H01G 9/2027; H01G 9/2031; C08G 2261/12; C08G 2261/3223; C08G 2261/3241; C08G 2261/91; C08G 2261/1412; C08G 2261/344; C08G 2261/146; C08G 2261/364; C08G 2261/124; C08G 61/126; Y02E 10/549
  See application file for complete search history.

(56) References Cited

U.S. PATENT DOCUMENTS

2017/0338045 A1* 11/2017 Vak ................. H01L 27/302
2019/0040188 A1*  2/2019 Nanson ............ H01L 51/0558

FOREIGN PATENT DOCUMENTS

| KR | 1020150023515 | 3/2015 |
| KR | 1020170002967 | 1/2017 |
| KR | 1020170026513 | 3/2017 |

OTHER PUBLICATIONS

Yoon, W. S., "Designing 1,5-Naphthyridine-2,6-dione-Based Conjugated Polymers for Higher Crystallinity and Enhanced Light Absorption to Achieve 9.63% Efficiency Polymer Solar Cells" Adv. Energy Mater. 2018, 8, 1701467.

* cited by examiner

[FIG. 1]
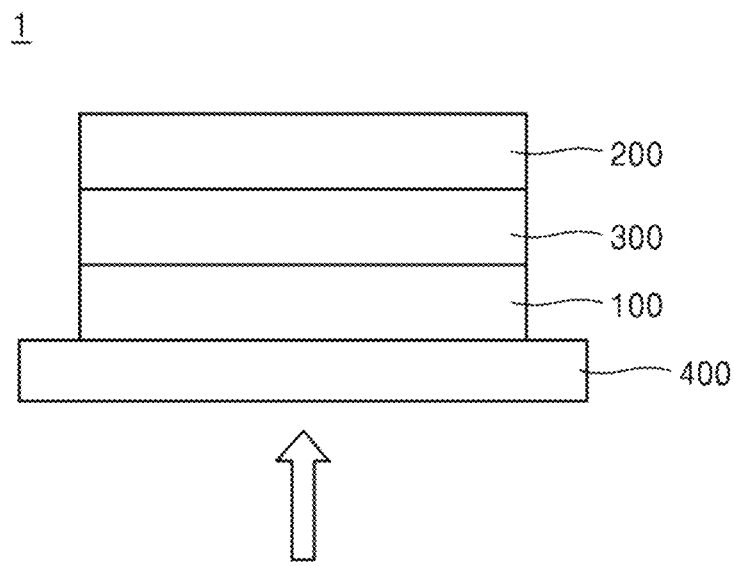
[FIG. 2]
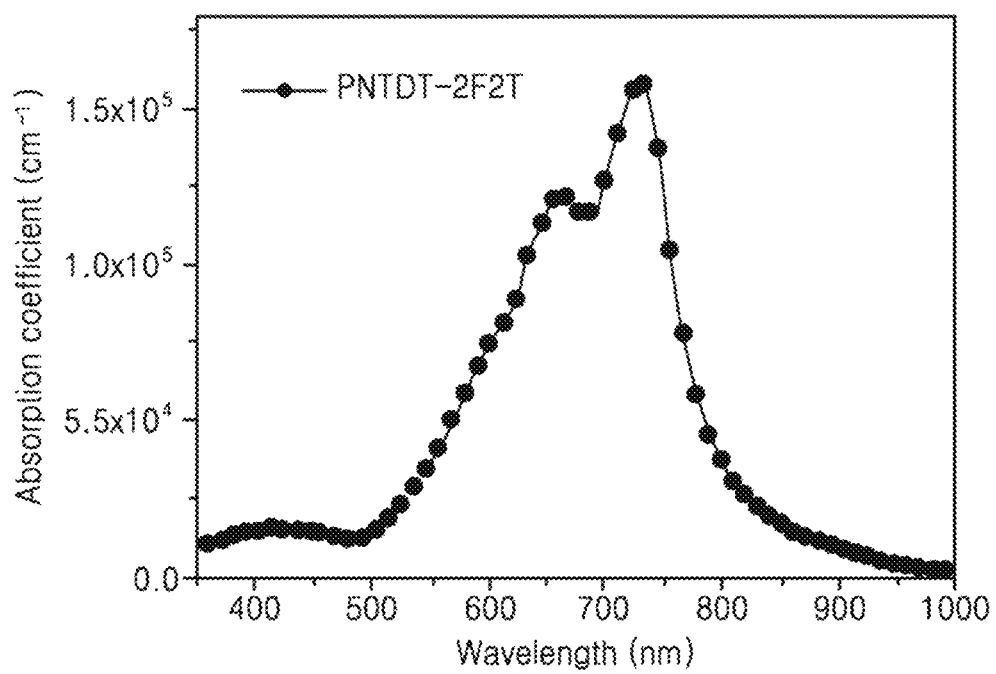

[FIG. 3]
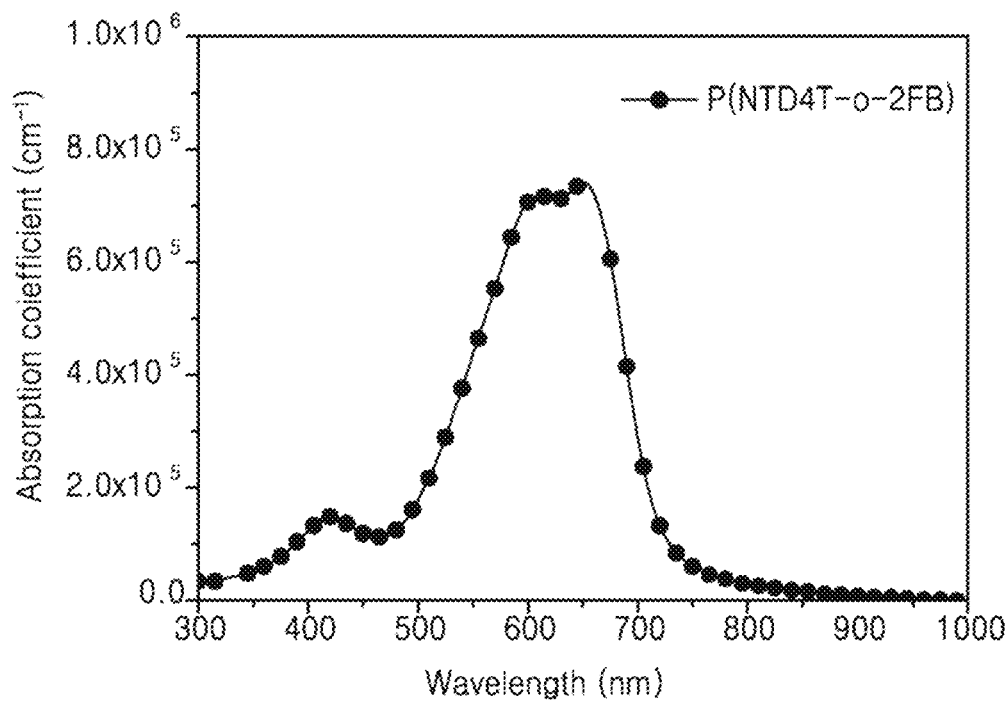
[FIG. 4]
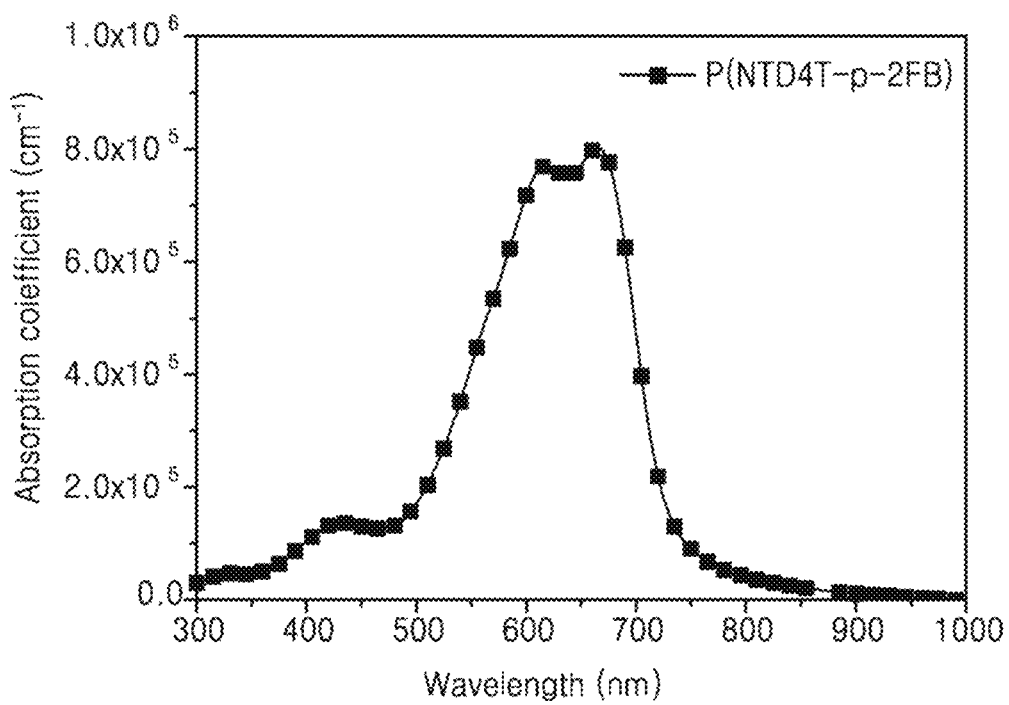

[FIG. 5]
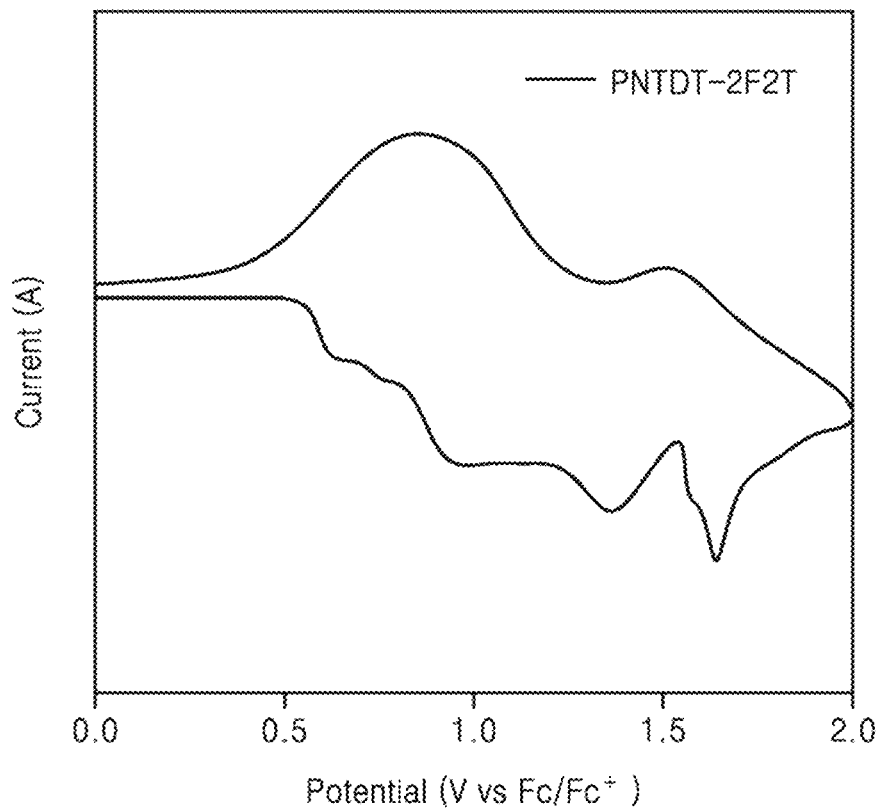
[FIG. 6]
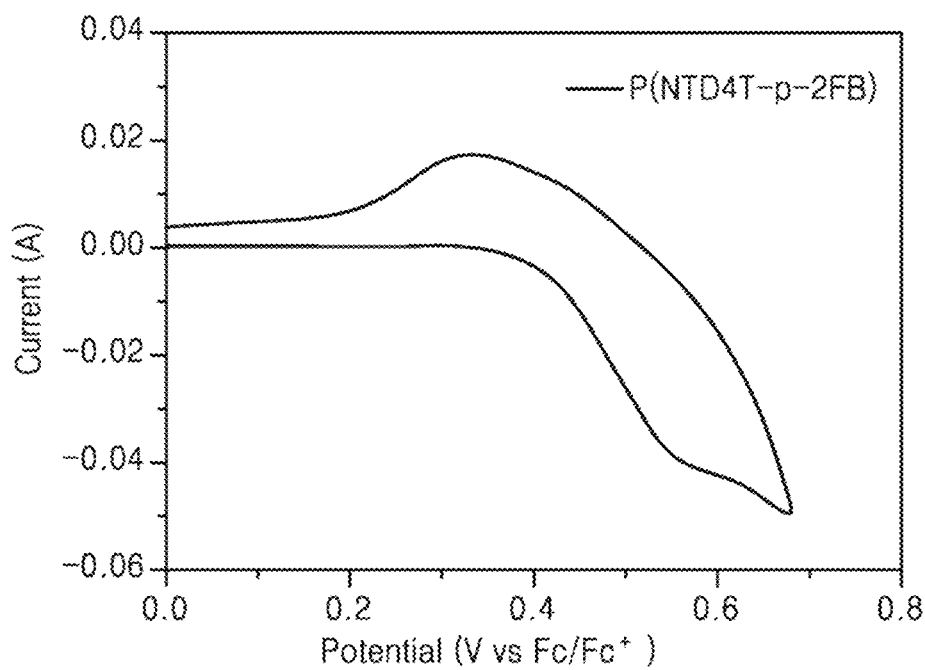

[FIG. 7]
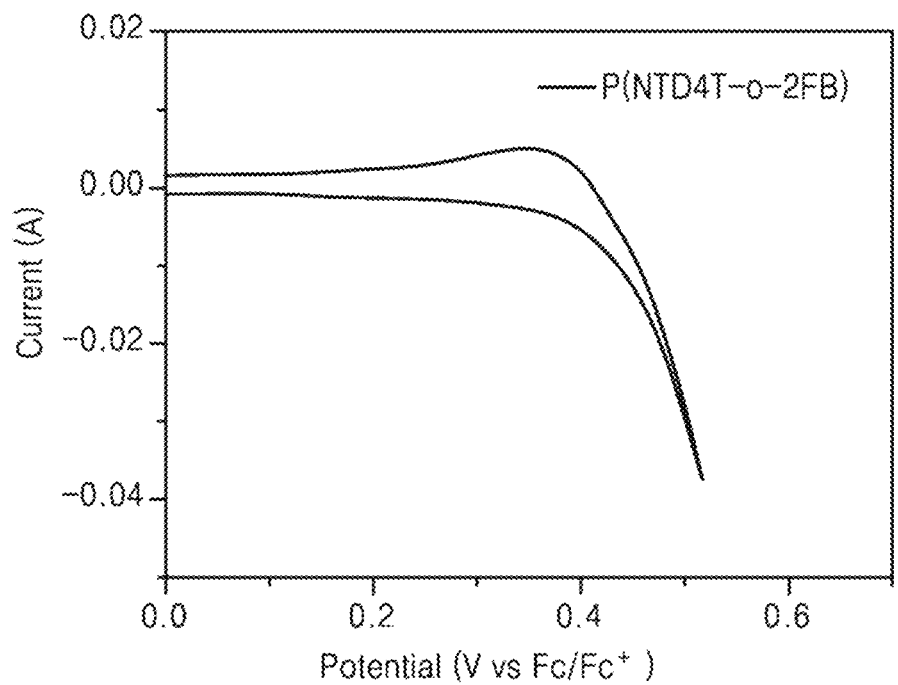
[FIG. 8]
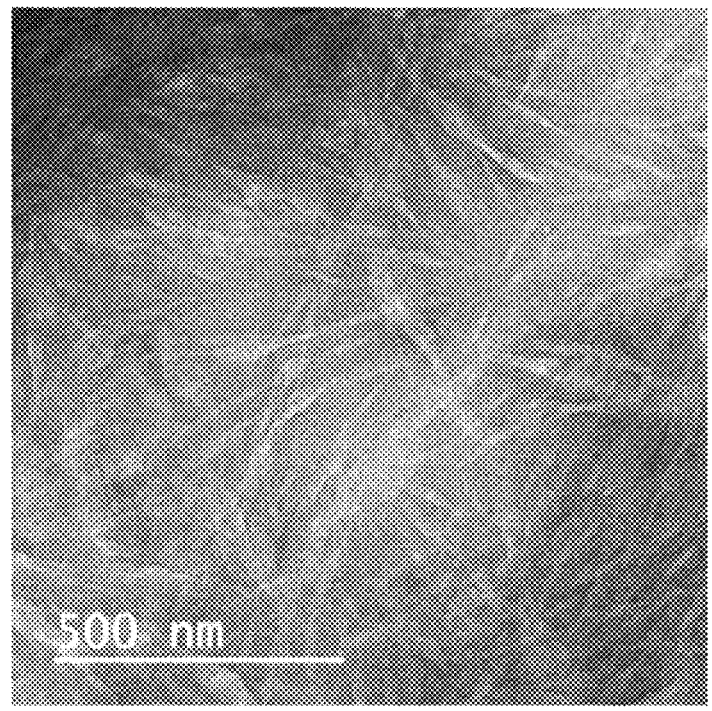

[FIG. 9]
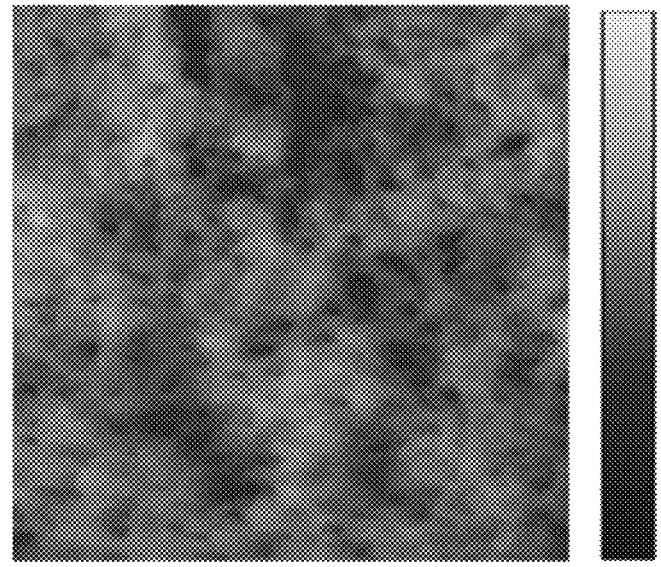
[FIG. 10]
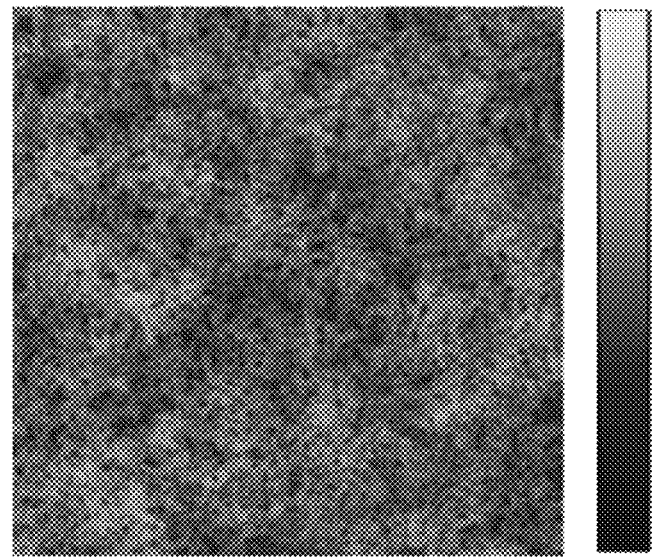

[FIG. 11]
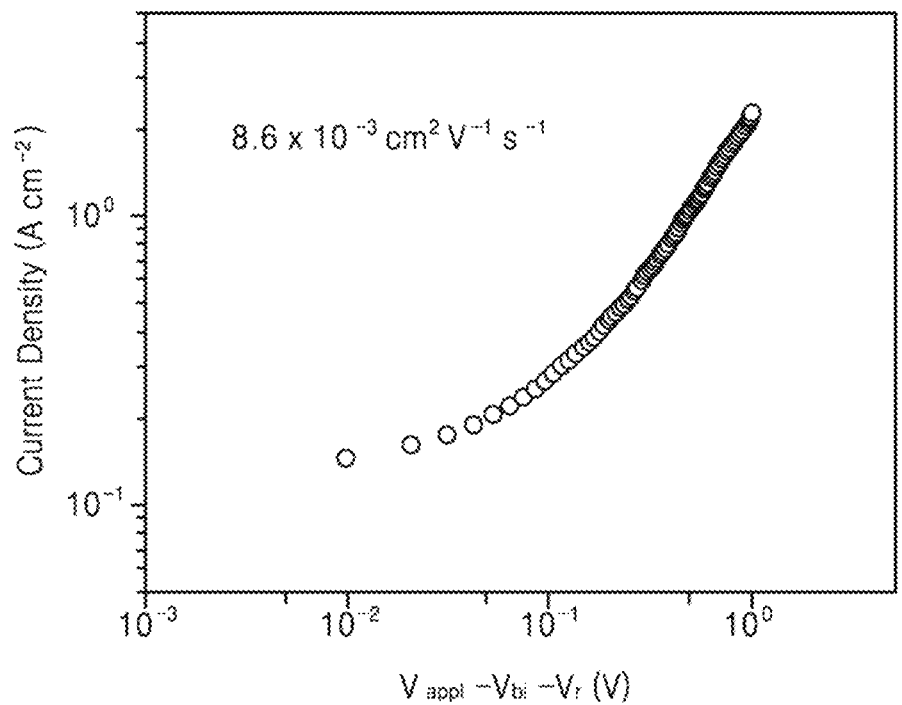

[FIG. 12]
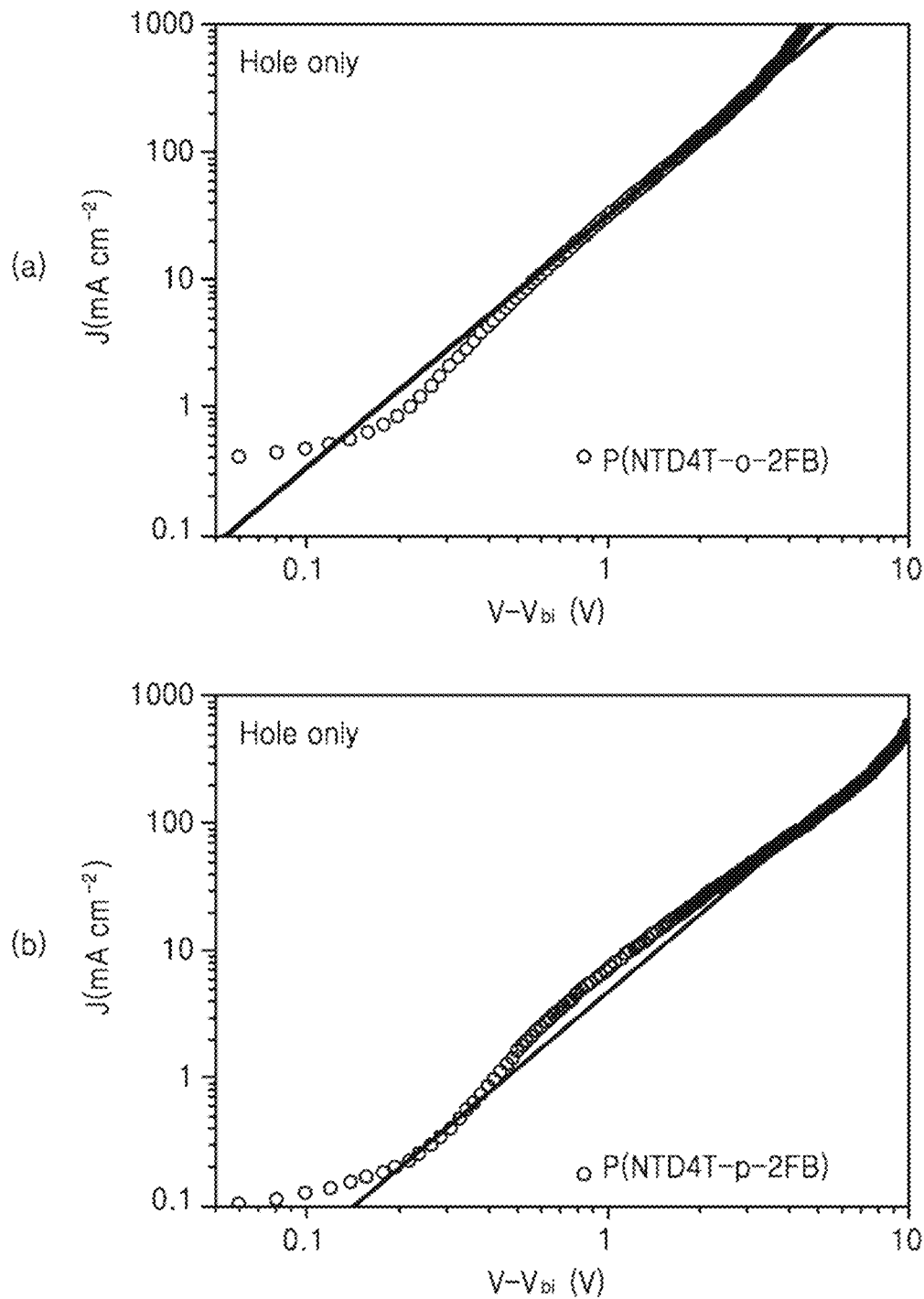

[FIG. 13]
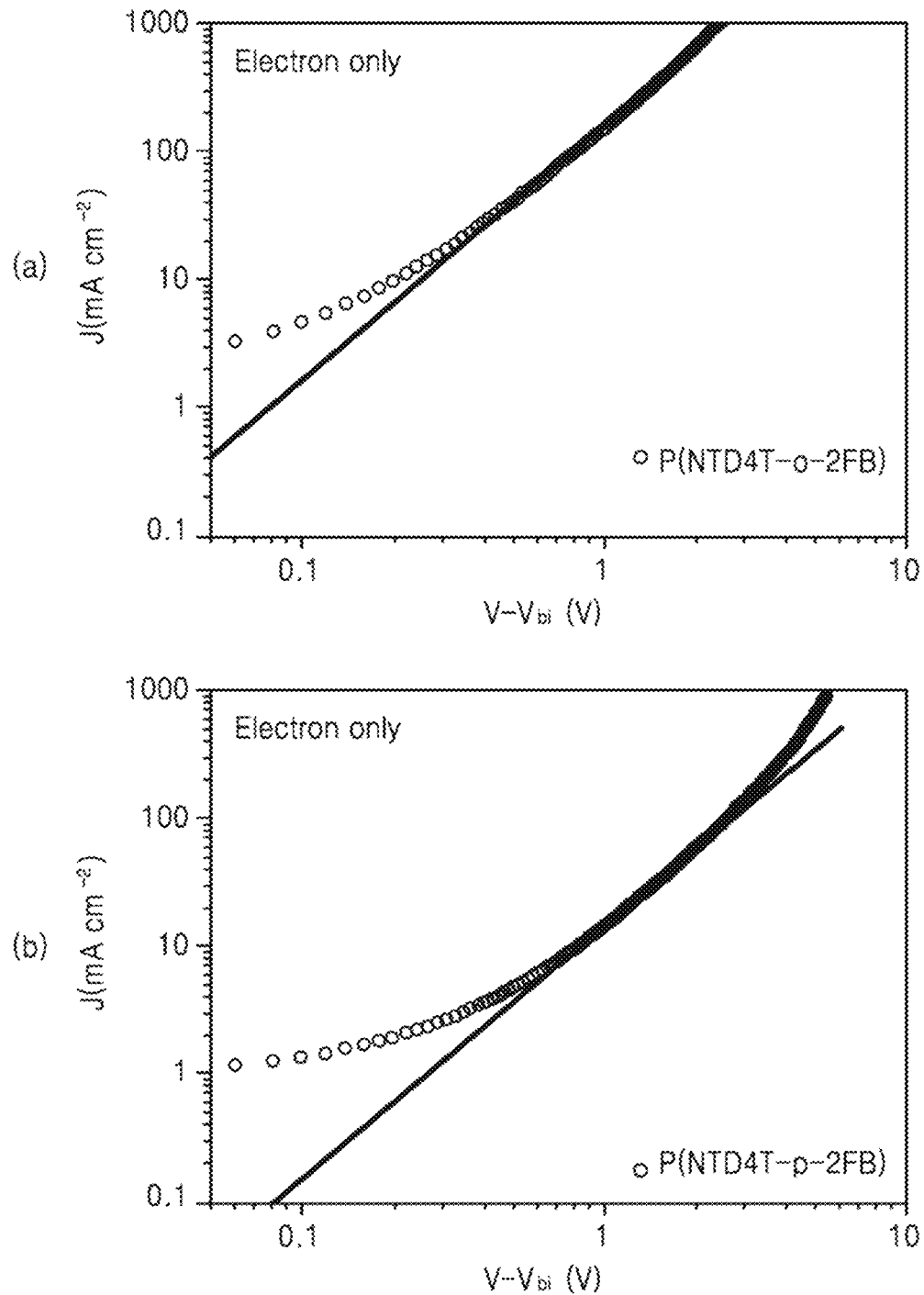

[FIG. 14]
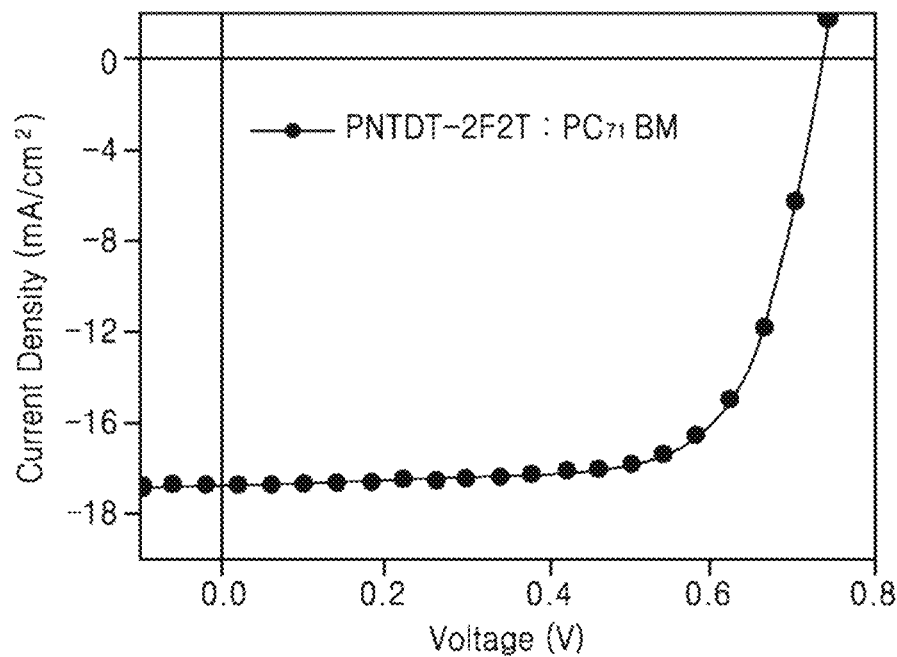
[FIG. 15]
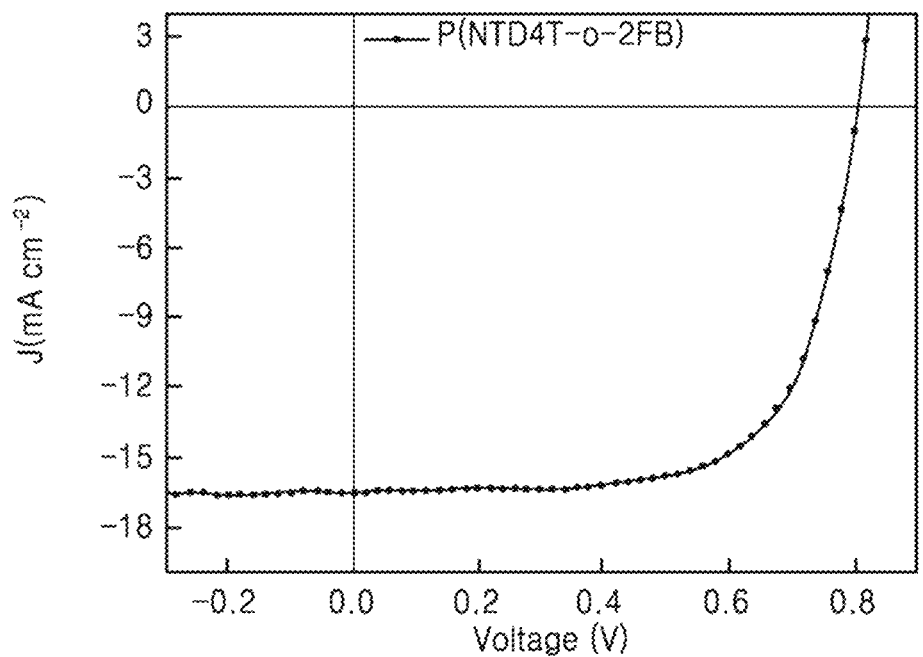

[FIG. 16]
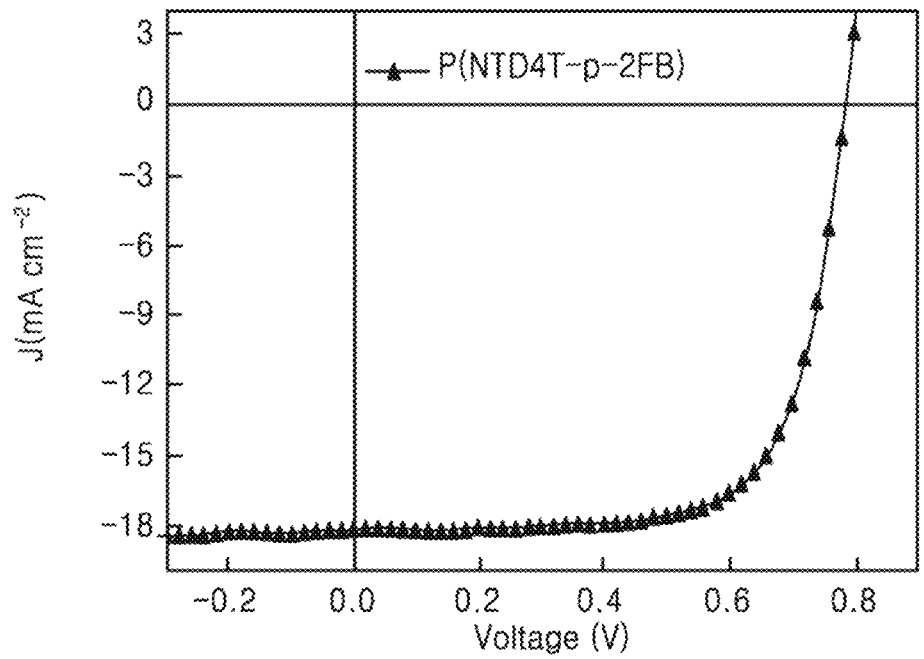
[FIG. 17]
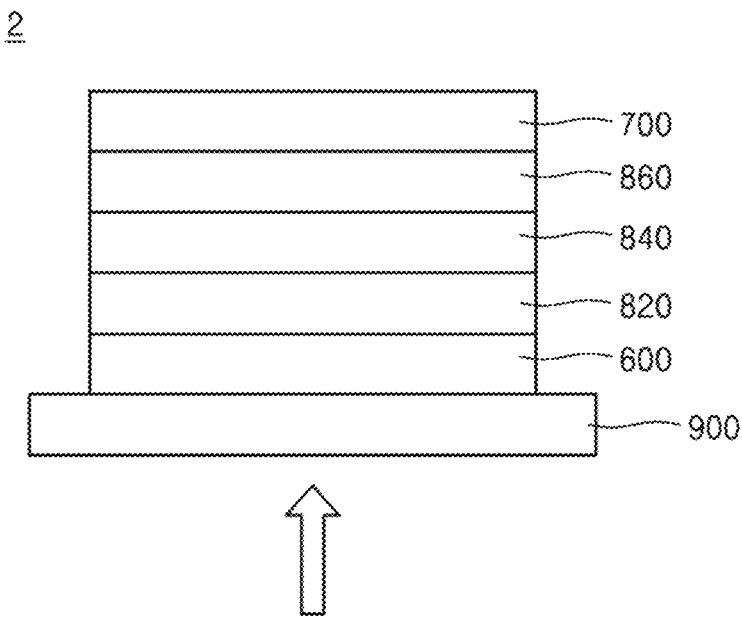

[FIG. 18]
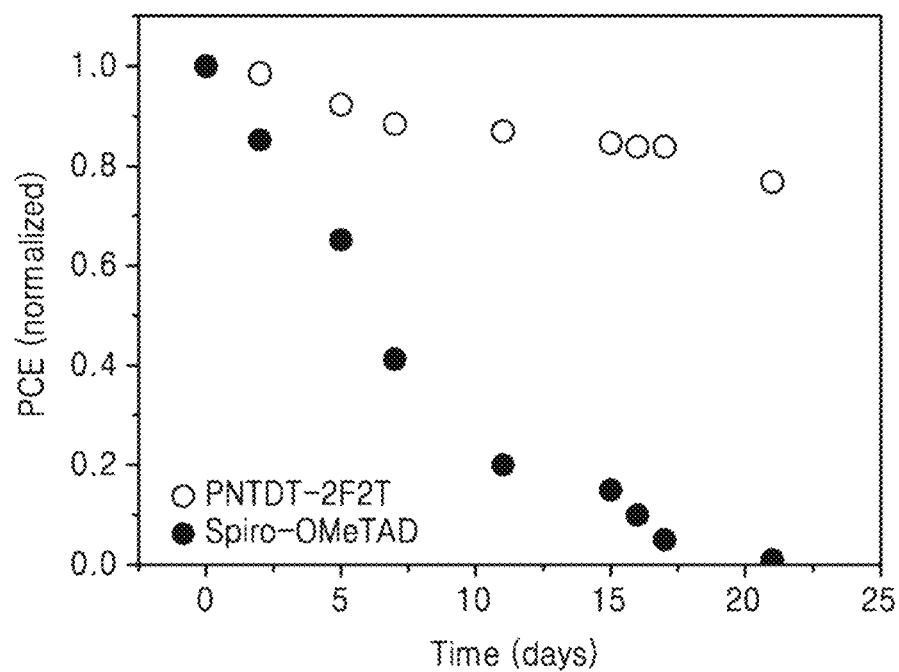
[FIG. 19]
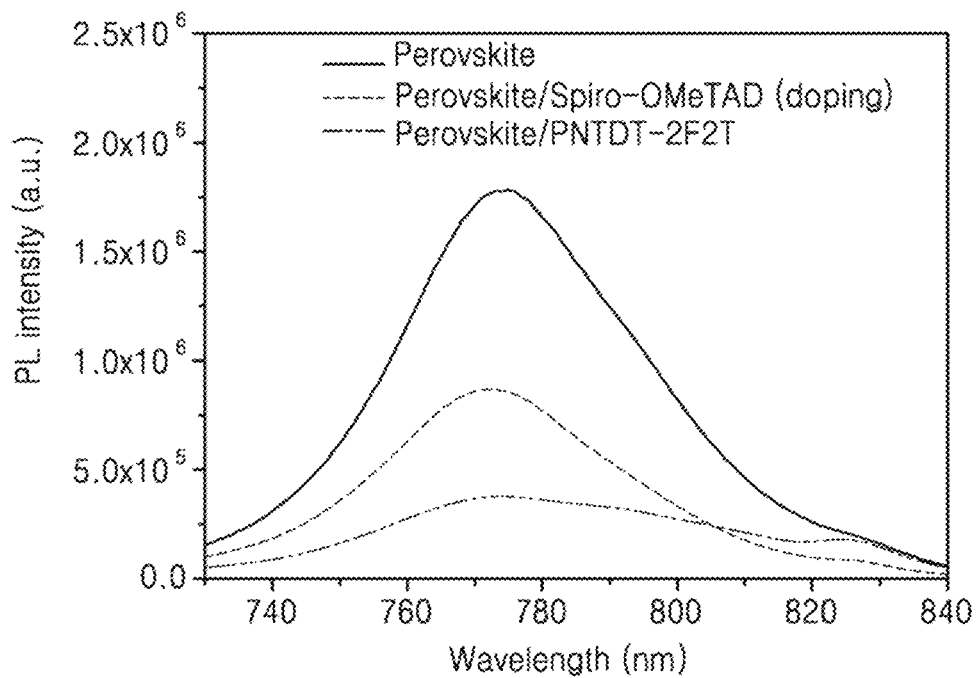

[FIG. 20]
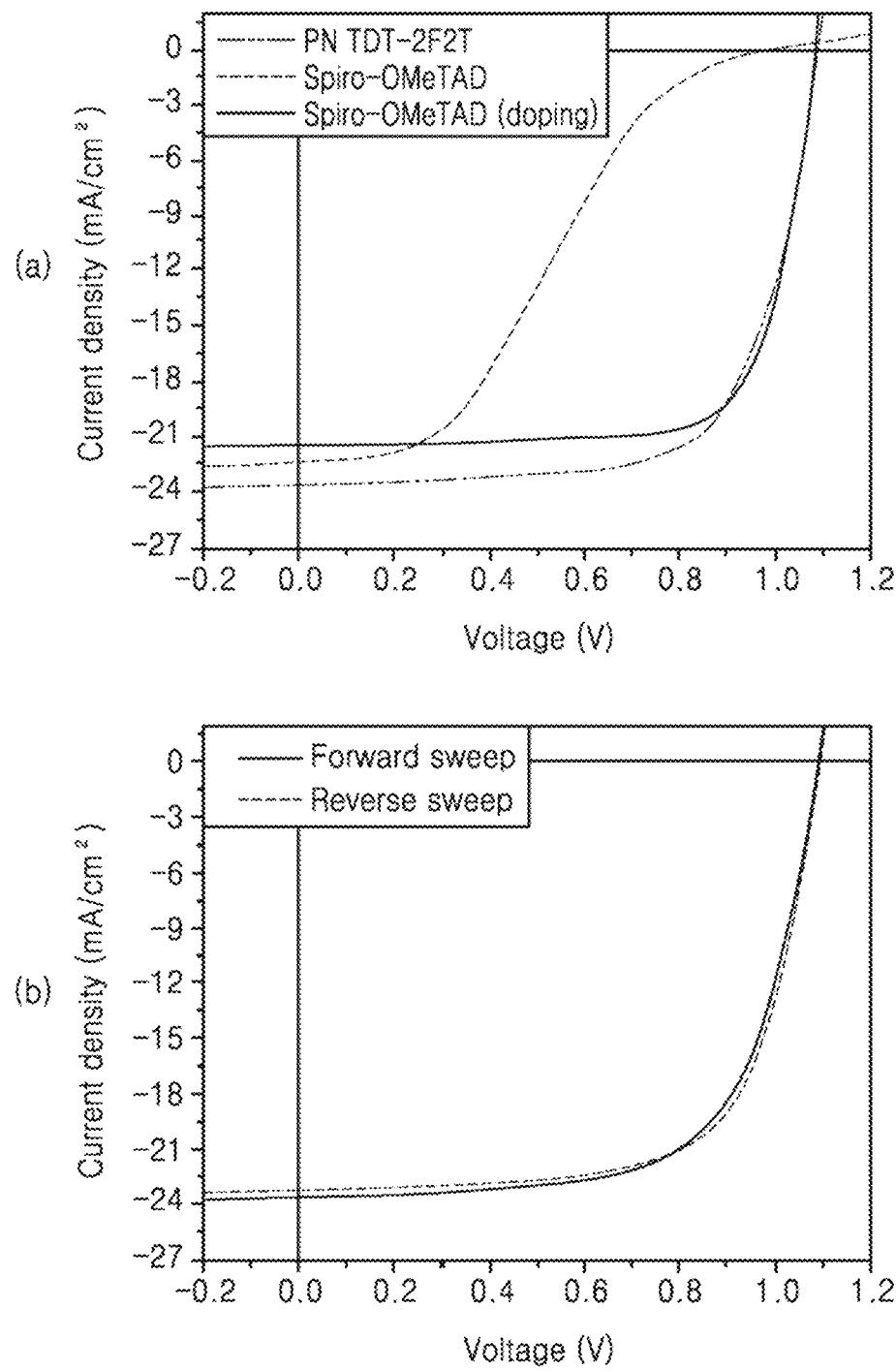

[FIG. 21]
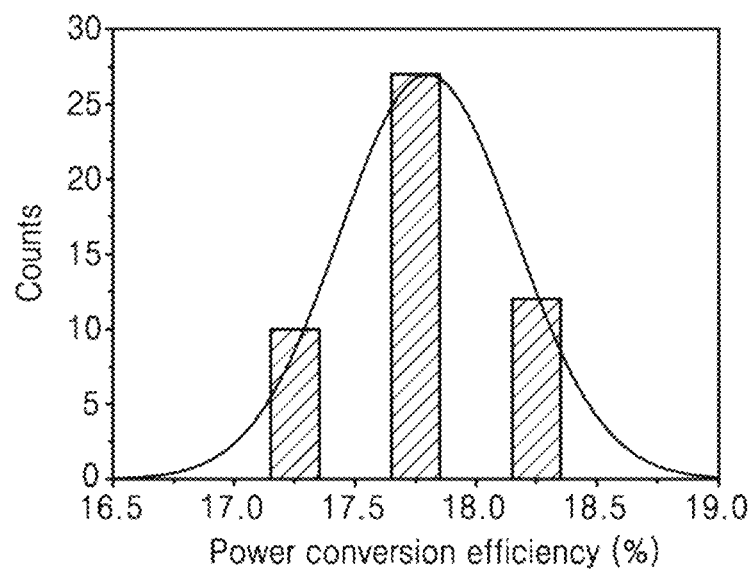

[FIG. 22]
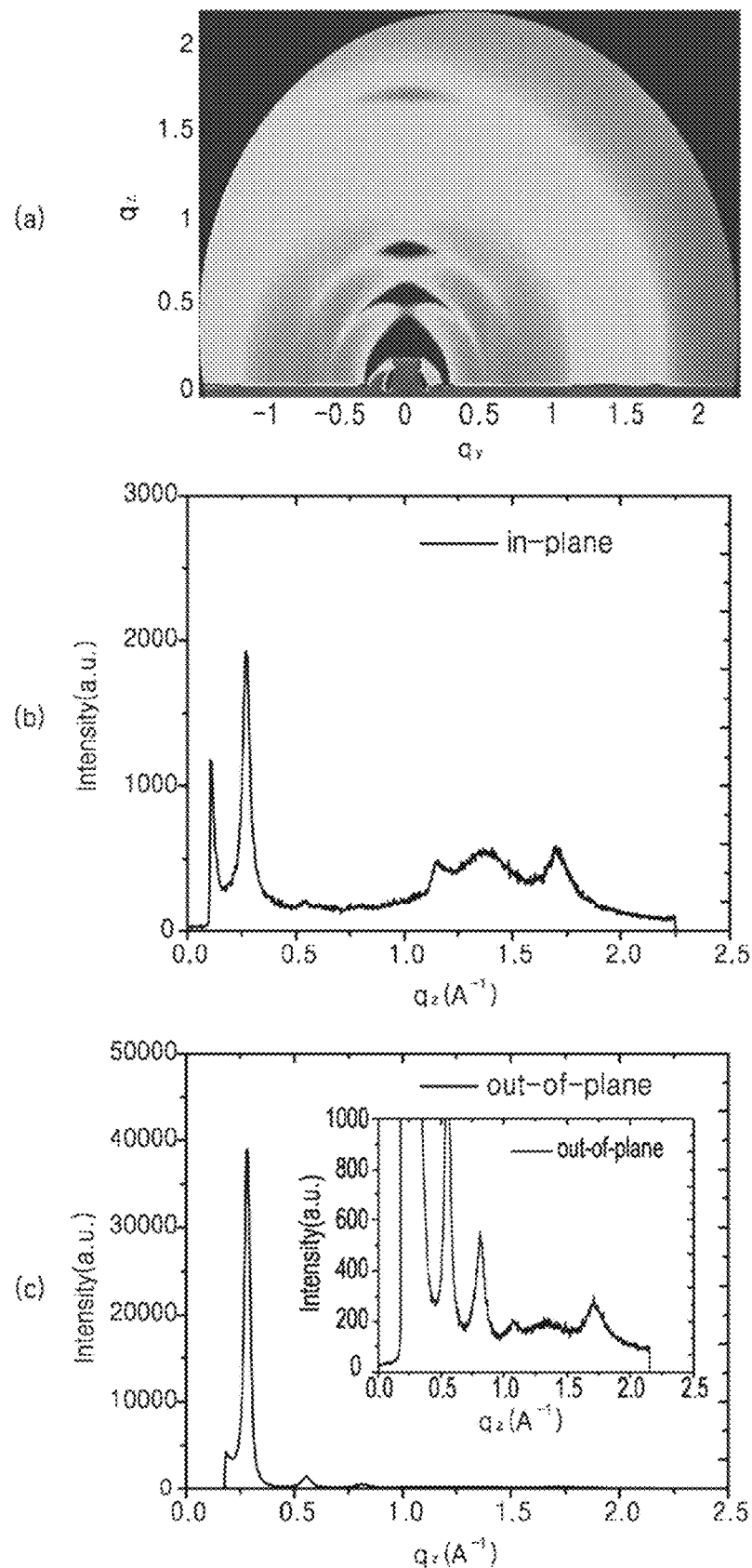

[FIG. 23]
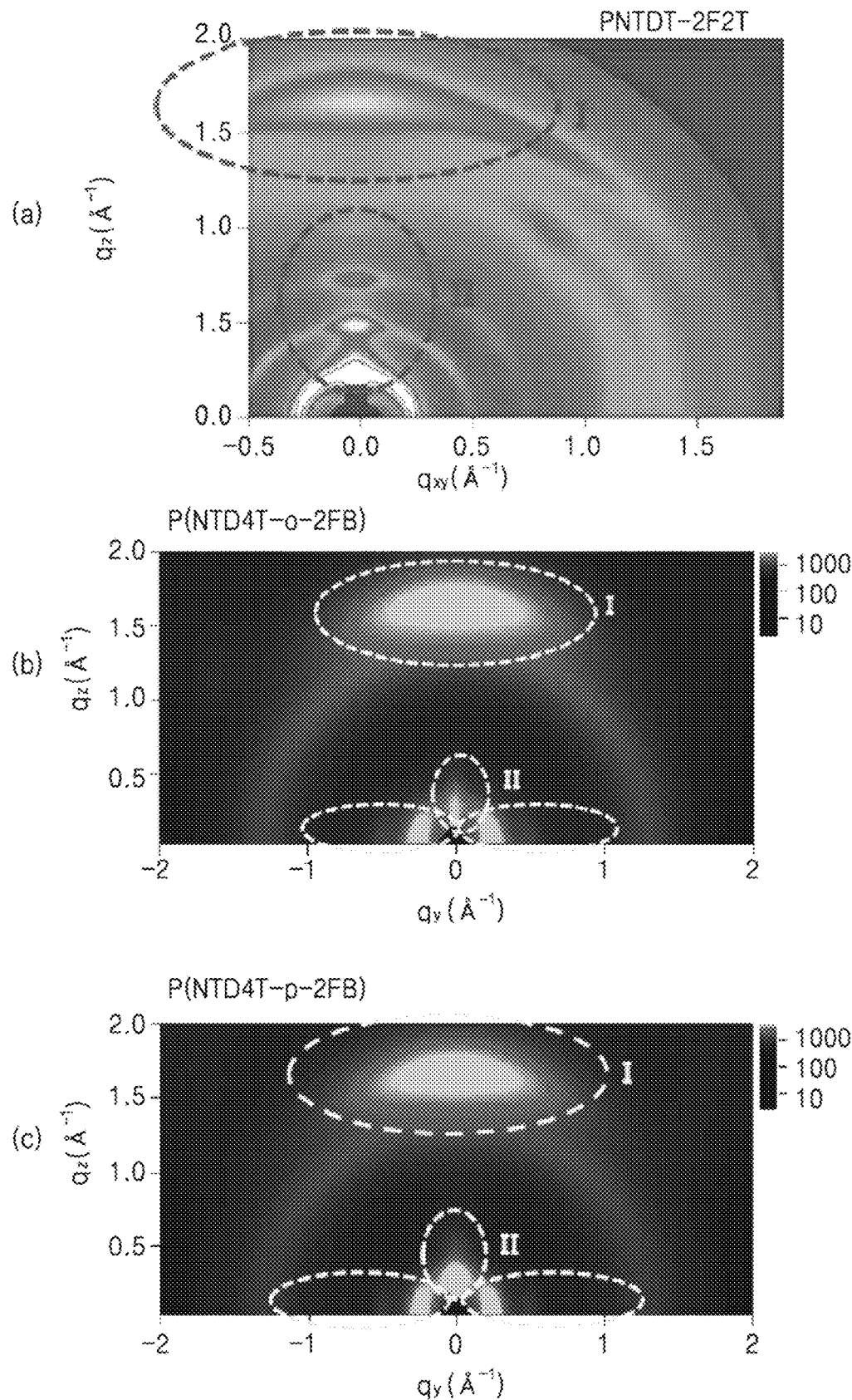

POLYMER, ORGANIC SOLAR CELL COMPRISING POLYMER, PEROVSKITE SOLAR CELL COMPRISING POLYMER

TECHNICAL FIELD

The present invention relates to a polymer, an organic solar cell comprising the polymer, and a perovskite solar cell comprising the polymer.

More specifically, the present invention relates to a novel polymer with 1,5-naphthyridine-2,6-dione structure which can be used as an electron donor compound in a photo-active layer of an organic solar cell or as a compound for a hole transport layer of a perovskite solar cell, and a solar cell with excellent light conversion efficiency which comprises the polymer.

Background Art

An organic solar cell is attracting much attention because of its high applicability in future-oriented fields such as electronic devices, automobiles, or smart windows. In the past decades, much research has been focused on developing new polymers and device structures to improve the light conversion efficiency of organic solar cells. As a result, the light conversion efficiency has been reached more than 10%.

However, polymers that can exhibit performance suitable for high performance organic solar cells are limited to a few types. In particular, since monomer materials constituting polymers are limited to a few kinds of high-performance monomers known in the art, there is a limitation in terms of diversity of material development.

In order to achieve high-performance light conversion efficiency in an organic solar cell for the solution process, it is necessary to use a polymer with good properties.

More specifically, there is a need for developing polymers that exhibit a broad light absorption in the solar spectrum without crystals and aggregation and have high charge mobility, appropriate molecular orientation, and excellent film morphology.

Since the performance of such polymers varies greatly depending on the choice of an electron donor-type or electron acceptor-type repeat unit material used in polymer polymerization, there is a need for developing a polymer for a high-performance organic solar cell through the use of a novel repeat unit material.

On the other hand, perovskite is a material in which cations, anions, and halides (or oxides) have a specific crystal structure. Research on perovskite solar cells using perovskite as a photo-active layer of solar cells is also in progress. Perovskite solar cells are fabricated by combining inexpensive inorganic and organic materials and have excellent photoelectric conversion efficiencies. Accordingly, they are drawing attention as the next-generation solar cell technology that replaces conventional silicon single crystal solar cells.

Hole transport layer materials that can exhibit performance of a high-performance perovskite solar cell are very limited. Especially, a polymer for a hole transport layer is limited to only a few of the monomers that constitute the polymer for a photo-active layer of a conventional high-performance organic solar cell and thus has a further limitation in terms of diversity in material development.

In order to achieve high-performance light conversion efficiency of the perovskite solar cell, it is necessary to use a polymer for a hole transport layer which has high charge mobility.

Since the characteristics of such polymers vary greatly depending on the choice of an electron donor-type or electron acceptor-type repeat unit material used in polymer polymerization, there is a need for developing a polymer for a high-performance hole transport layer through the use of a novel repeat unit material.

Technical Problem

The present invention provides a novel polymer formed with new monomers, a high-efficiency organic solar cell comprising the polymer, and a perovskite solar cell comprising the polymer.

Specifically, the present invention relates to a polymer for a photo-active layer of an organic solar cell having an excellent light absorption rate in a visible light region.

Additionally, the present invention relates to a polymer that has excellent crystallinity, high charge mobility, and an energy level suitable for the use as an electron donor compound in a photo-active layer of an organic solar cell.

Moreover, the present invention provides a perovskite solar cell which uses a novel polymer with high hole mobility as a compound for a hole transport layer and thereby has high efficiency and excellent service life without an additive.

The present invention also relates to an organic solar cell comprising the polymer or a perovskite solar cell comprising the polymer, which has the excellent light conversion efficiency.

Technical Solution

The present invention is devised to solve the above problems and relates to a polymer represented by the following Structural Formula 1.

[Structural Formula 1]

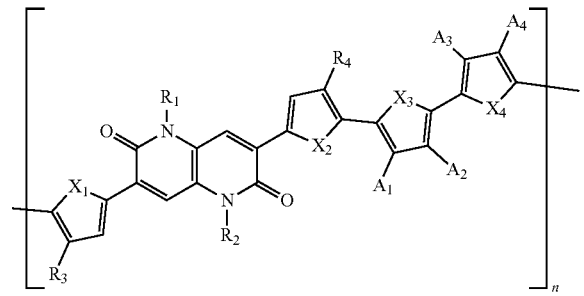

In Structural Formula 1, $X_1$, $X_2$, $X_3$, and $X_4$ are each independently O, S, Se, NH, or NR', $R_1$, $R_2$, $R_3$, and $R_4$ are each independently an alkyl group having 1 to 50 carbon atoms, an aryl group having 6 to 50 carbon atoms, or —COOR', $A_1$, $A_2$, $A_3$, and $A_4$ are each independently H, F, CN, or —COOR', R' is an alkyl group having 1 to 50 carbon atoms or an aryl group having 6 to 50 carbon atoms, and n is an integer ranging from 1 to 1000.

In one example, $R_1$, $R_2$, $R_3$, $R_4$, and R' may each be independently an alkyl group having 1 to 26 carbon atoms or an aryl group having 6 to 32 carbon atoms.

In one example, $R_1$ and $R_2$ may each be independently an alkyl group having 5 to 14 carbon atoms.

In one example, $R_3$ and $R_4$ may each be independently an alkyl group having 9 to 22 carbon atoms.

In addition, the present invention is devised to solve the above problems and relates to a polymer represented by the following Structural Formula 2.

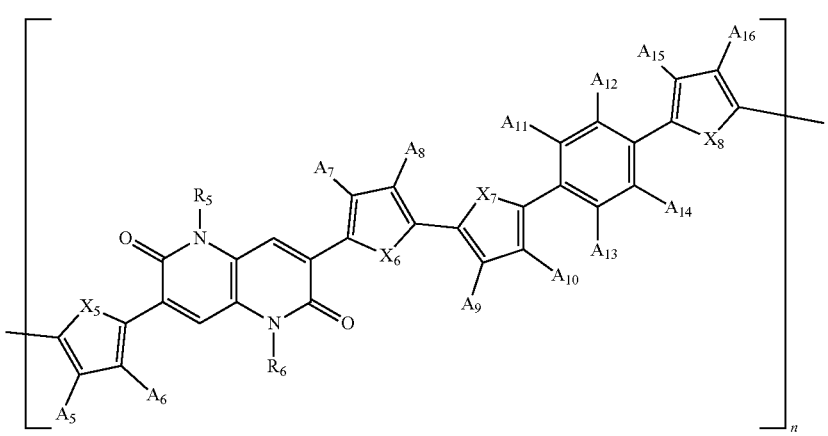

In Structural Formula 2, $X_5$, $X_6$, $X_7$, and $X_8$ are each independently O, S, Se, NH, or NR", $R_5$ and $R_6$ are each independently an alkyl group having 1 to 50 carbon atoms, an aryl group having 6 to 50 carbon atoms, or —$(CH_2CH_2O)_mCH_3$, $A_5$, $A_6$, $A_7$, $A_8$, $A_9$, $A_{10}$, $A_{11}$, $A_{12}$, $A_{13}$, $A_{14}$, $A_{15}$, and $A_{16}$ are each independently H, F, Cl, CN, —COOR", —OR", an alkyl group having 1 to 50 carbon atoms, or an aryl group having 6 to 50 carbon atoms, R" is each independently an alkyl group having 1 to 50 carbon atoms, an aryl group having 6 to 50 carbon atoms, or —$(CH_2CH_2O)_mCH_3$, m is an integer ranging from 1 to 20, and n is an integer ranging from 1 to 1000.

In one example, $R_5$, $R_6$, $A_5$, $A_6$, $A_7$, $A_8$, and R" may each be independently an alkyl group having 1 to 26 carbon atoms or an aryl group having 6 to 32 carbon atoms.

In one example, $R_5$ and $R_6$ may each be independently an alkyl group having 5 to 14 carbon atoms.

In one example, $A_5$, $A_6$, $A_7$, and $A_8$ may each be independently an alkyl group having 9 to 22 carbon atoms.

In one example, any two of $A_{11}$, $A_{12}$, $A_{13}$, and $A_{14}$ may be substituted at ortho- or para-positions and may each be independently F or Cl.

Moreover, the present invention is devised to solve the above problems and relates to a polymer for a photo-active layer of an organic solar cell which is represented by the following Structural Formula 1.

In Structural Formula 1, $X_1$, $X_2$, $X_3$, and $X_4$ are each independently O, S, Se, NH, or NR', $R_1$, $R_2$, $R_3$, and $R_4$ are each independently an alkyl group having 1 to 50 carbon atoms, an aryl group having 6 to 50 carbon atoms, or —COOR', $A_1$, $A_2$, $A_3$, and $A_4$ are each independently H, F, CN, or —COOR', R' is an alkyl group having 1 to 50 carbon atoms or an aryl group having 6 to 50 carbon atoms, and n is an integer ranging from 1 to 1000.

In one example, $R_1$, $R_2$, $R_3$, $R_4$, and R' may each be independently an alkyl group having 1 to 26 carbon atoms or an aryl group having 6 to 32 carbon atoms.

In one example, $R_1$ and $R_2$ may each be independently an alkyl group having 5 to 14 carbon atoms.

In one example, $R_3$ and $R_4$ may each be independently an alkyl group having 9 to 22 carbon atoms.

In one example, the polymer may have a light absorption coefficient of $5 \times 10^4$ cm$^{-1}$ or more at a maximum light absorption wavelength within wavelengths from 380 nm to 1000 nm.

The present invention also relates to an organic solar cell comprising the above-described polymer. The organic solar cell includes a first electrode and a second electrode disposed facing each other and a photo-active layer disposed between the first electrode and the second electrode, wherein the photo-active layer is characterized by including a polymer represented by the following Structural Formula 1.

[Structural Formula 1]

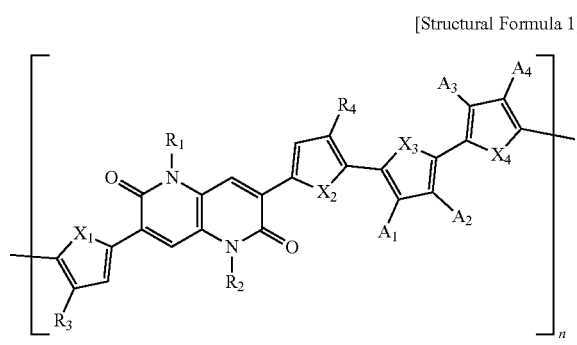

[Structural Formula 1]

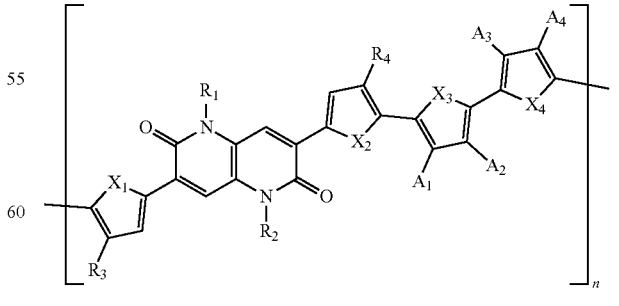

In structural Formula 1, $X_1$, $X_2$, $X_3$, and $X_4$ are each independently O, S, Se, NH, or NR', $R_1$, $R_2$, $R_3$, and $R_4$ are each independently an alkyl group having 1 to 50 carbon atoms, an aryl group having 6 to 50 carbon atoms, or —COOR', $A_1$, $A_2$, $A_3$, and $A_4$ are each independently H, F, CN, or —COOR', R' is an alkyl group having 1 to 50 carbon atoms or an aryl group having 6 to 50 carbon atoms, and n is an integer ranging from 1 to 1000.

In one example, the first electrode of the organic solar cell may be a transparent electrode, the second electrode may be a metal electrode, and the organic solar cell may further include a substrate positioned on a surface of the first electrode opposite to a surface on which the photo-active layer is present.

In one example, the photo-active layer may be a bulk-heterojunction layer that further includes an electron acceptor compound.

In one example, the electron acceptor compound may be any one selected from the group consisting of fullerene, fullerene derivatives, carbon nanotubes, carbon nanotube derivatives, bathocuproine, semiconductor elements, semiconductor compounds, and a combination thereof.

A light conversion efficiency (%) of the organic solar cell may be 8% or more.

The present invention is devised to solve the above problems and relates to a polymer for a photo-active layer of an organic solar cell which is represented by the following Structural Formula 2.

[Structural Formula 2]

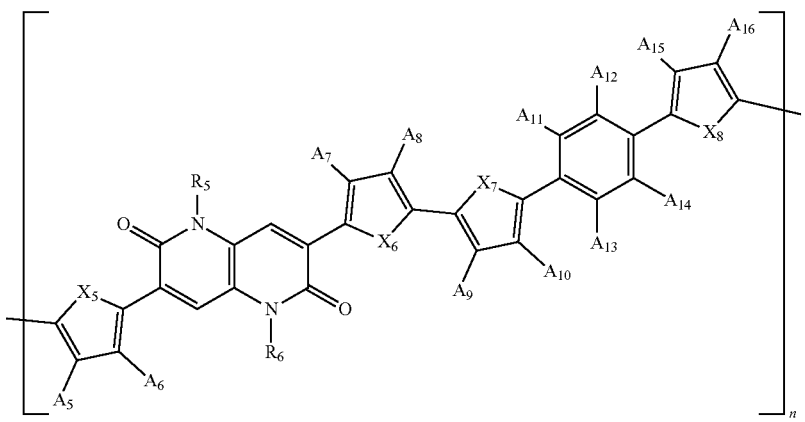

In Structural Formula 2, $X_5$, $X_6$, $X_7$, and $X_8$ are each independently O, S, Se, NH, or NR", $R_5$ and $R_6$ are each independently an alkyl group having 1 to 50 carbon atoms, an aryl group having 6 to 50 carbon atoms, or —$(CH_2CH_2O)_m CH_3$, $A_5$, $A_6$, $A_7$, $A_8$, $A_9$, $A_{10}$, $A_{11}$, $A_{12}$, $A_{13}$, $A_{14}$, $A_{15}$, and $A_{16}$ are each independently H, F, Cl, CN, —COOR", —OR", an alkyl group having 1 to 50 carbon atoms, or an aryl group having 6 to 50 carbon atoms, R" is each independently an alkyl group having 1 to 50 carbon atoms, an aryl group having 6 to 50 carbon atoms, or —$(CH_2CH_2O)_m CH_3$, m is an integer ranging from 1 to 20, and n is an integer ranging from 1 to 1000.

In one example, $R_5$, $R_6$, $A_5$, $A_6$, $A_7$, $A_8$, and R" may each be independently an alkyl group having 1 to 26 carbon atoms or an aryl group having 6 to 32 carbon atoms.

In one example, $R_5$ and $R_6$ may each be independently an alkyl group having 5 to 14 carbon atoms.

In one example, $A_5$, $A_6$, $A_7$, and $A_8$ may each be independently an alkyl group having 9 to 22 carbon atoms.

In one example, any two of $A_{11}$, $A_{12}$, $A_{13}$, and $A_{14}$ may be substituted at ortho- or para-positions and may each be independently F or Cl.

In one example, the polymer may have a light absorption coefficient of $1.5 \times 10^5$ cm$^{-1}$ or more at a maximum light absorption wavelength within wavelengths from 300 nm to 1000 nm.

In one example, the polymer may have a crystalline coherence length (CCL) in a range from 18 Å to 30 Å.

The present invention also relates to an organic solar cell comprising the above-described polymer. The organic solar cell includes a first electrode and a second electrode disposed facing each other and a photo-active layer disposed between the first electrode and the second electrode, wherein the photo-active layer is characterized by including a polymer represented by the following Structural Formula 2.

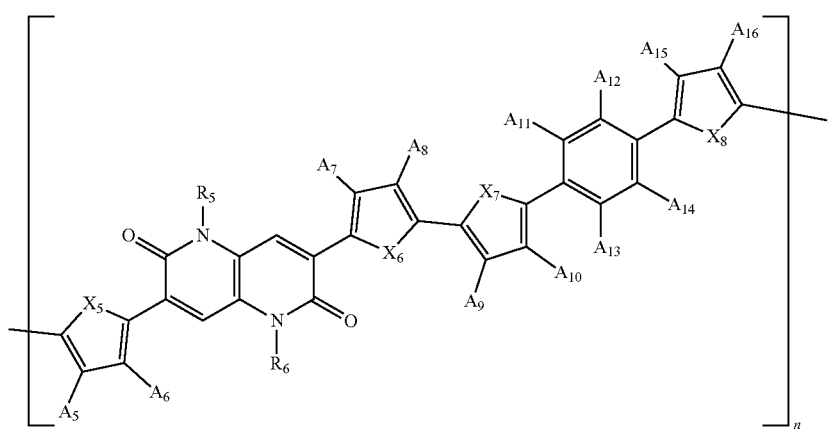

[Structural Formula 2]

In Structural Formula 2, $X_5$, $X_6$, $X_7$, and $X_8$ are each independently O, S, Se, NH, or NR", $R_5$ and $R_6$ are each independently an alkyl group having 1 to 50 carbon atoms, an aryl group having 6 to 50 carbon atoms, or —$(CH_2CH_2O)_mCH_3$, $A_5$, $A_6$, $A_7$, $A_8$, $A_9$, $A_{10}$, $A_{11}$, $A_{12}$, $A_{13}$, $A_{14}$, $A_{15}$, and $A_{16}$ are each independently H, F, Cl, CN, —COOR", —OR", an alkyl group having 1 to 50 carbon atoms, or an aryl group having 6 to 50 carbon atoms, R" is each independently an alkyl group having 1 to 50 carbon atoms, an aryl group having 6 to 50 carbon atoms, or —$(CH_2CH_2O)_mCH_3$, m is an integer ranging from 1 to 20, and n is an integer ranging from 1 to 1000.

In one example, the first electrode of the organic solar cell may be a transparent electrode, the second electrode may be a metal electrode, and the organic solar cell may further include a substrate positioned on a surface of the first electrode opposite to a surface on which the photo-active layer is present.

In one example, the photo-active layer may be a bulk-heterojunction layer that further includes an electron acceptor compound.

In one example, the electron acceptor compound may be any one selected from a group consisting of fullerene, fullerene derivatives, non-fullerene organic compounds, carbon nanotubes, carbon nanotube derivatives, bathocuproine, semiconductor elements, semiconductor compounds, and a combination thereof.

A light conversion efficiency (%) of the organic solar cell may be 9% or more.

Moreover, the present invention is devised to solve the above problems and relates to a polymer for a home transport layer of a perovskite solar cell which is represented by the following Structural Formula 1.

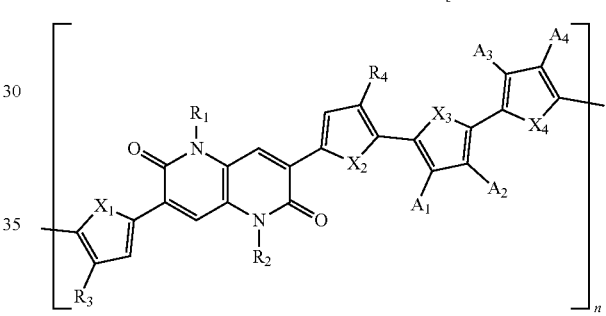

[Structural Formula 1]

In Structural Formula 1, $X_1$, $X_2$, $X_3$, and $X_4$ are each independently O, S, Se, NH, or NR', $R_1$, $R_2$, $R_3$, and $R_4$ are each independently an alkyl group having 1 to 50 carbon atoms, an aryl group having 6 to 50 carbon atoms, or —COOR', $A_1$, $A_2$, $A_3$, and $A_4$ are each independently H, F, CN, or —COOR', R' is an alkyl group having 1 to 50 carbon atoms or an aryl group having 6 to 50 carbon atoms, and n is an integer ranging from 1 to 1000.

In one example, $R_1$, $R_2$, $R_3$, $R_4$, and R' may each be independently an alkyl group having 1 to 26 carbon atoms or an aryl group having 6 to 32 carbon atoms.

In one example, $R_1$ and $R_2$ may each be independently an alkyl group having 5 to 14 carbon atoms.

In one example, $R_3$ and $R_4$ may each be independently an alkyl group having 9 to 22 carbon atoms.

In one example, a CCL may be in a range from 18 Å to 30 Å.

The present invention also relates to a perovskite solar cell comprising the above-described polymer. The perovskite solar cell includes a first electrode and a second electrode disposed facing each other, and an electron transport layer, a perovskite layer, and a hole transport layer are stacked between the first and second electrodes, wherein the hole transport layer is characterized by including a polymer represented by the following Structural Formula 1.

[Structural Formula 1]

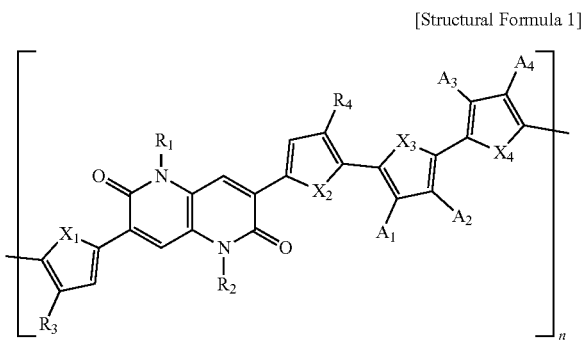

In Structural Formula 1, $X_1$, $X_2$, $X_3$, and $X_4$ are each independently O, S, Se, NH, or NR', $R_1$, $R_2$, $R_3$, and $R_4$ are each independently an alkyl group having 1 to 50 carbon atoms, an aryl group having 6 to 50 carbon atoms, or —COOR', $A_1$, $A_2$, $A_3$, and $A_4$ are each independently H, F, CN, or —COOR', R' is an alkyl group having 1 to 50 carbon atoms or an aryl group having 6 to 50 carbon atoms, and n is an integer ranging from 1 to 1000.

In one example, the first electrode of the perovskite solar cell may be a transparent electrode, the second electrode may be a metal electrode, and the perovskite solar cell may further include a substrate positioned on a surface of the first electrode opposite to a surface on which the perovskite layer is present.

In one example, the electron transport layer may include titanium oxide ($TiO_2$), sol-gel tin oxide ($SnO_2$), sol-gel zinc oxide (ZnO), nanoparticle tin oxide (NP—$SnO_2$), nanoparticle zinc oxide (NP—ZnO), fullerene ($C_{60}$, $C_{70}$), fullerene derivatives ($PC_{61}BM$, $PC_{71}BM$, $ICB_{60}A$, $ICB_{70}A$), non-fullerene organic semiconductor electron acceptor compounds, and a composite layer in a metal oxide/organic semiconductor electron acceptor form.

A light conversion efficiency (%) of the perovskite solar cell may be 14% or more.

Advantageous Effects

The present invention may provide a novel polymer formed with new monomers, a high-efficiency organic solar cell comprising the polymer, and a perovskite solar cell comprising the polymer.

In addition, the present invention may provide a polymer for a photo-active layer of an organic solar cell, which has an excellent light absorption rate in a visible light region, excellent crystallinity, high charge mobility, and an energy level suitable for the use as an electron donor compound in a photo-active layer of an organic solar cell.

Moreover, the present invention may provide a perovskite solar cell which uses a novel polymer with high hole mobility as a compound for a hole transport layer and thereby has high efficiency and excellent service life without additives.

The present invention also relates to an organic solar cell comprising the polymer or a perovskite solar cell comprising the polymer, and may provide an organic and perovskite solar cells having excellent light conversion efficiency.

It is apparent that the scope of the present invention is not limited by these effects.

DESCRIPTION OF DRAWINGS

FIG. 1 is a schematic diagram illustrating a structure of an organic solar cell according to the present invention.

FIGS. 2 to 4 illustrate measurement results of light absorption coefficients according to absorption wavelengths of a polymer for a photo-active layer in accordance with Preparation Example 1 of the present invention.

FIGS. 5 to 7 illustrate cyclic voltammetry analysis results for measuring energy levels of polymers in accordance with Preparation Examples 1 to 3 of the present invention.

FIGS. 8 to 10 illustrate atomic force microscopy (AFM) images of a photo-active layer of organic solar cells in accordance with Examples 1 to 3 of the present invention.

FIGS. 11 to 13 illustrate measurement results of hole mobility using space charge limited current (SCLC) of an organic solar cell in accordance with Example 1 of the present invention.

FIGS. 14 to 16 illustrate current density (J)-voltage (V) graph results of organic solar cells in accordance with Example 1 to 3 of the present invention.

FIG. 17 is a schematic diagram illustrating a structure of a perovskite solar cell according to the present invention.

FIG. 18 is a graph showing a result of measuring device service life of perovskite solar cells in accordance with Example 4 and Comparative Example 1 of the present invention.

FIG. 19 is a graph showing PL intensity quenching of perovskite thin films in accordance with Example 4 and Comparative Example 1 of the present invention.

FIGS. 20 and 21 are current density (J)-voltage (V) graphs of perovskite solar cells in accordance with Example 4 and Comparative Examples 1 and 2 and a graph showing hysteresis characteristics and average photoelectric conversion efficiency.

FIGS. 22 and 23 are photographs showing grazing-incidence wide-angle X-ray scattering (GIWAXS) analysis results of a polymer according to one embodiment of the present invention.

MODE FOR INVENTION

Hereinafter, the present invention will be described in more detail with reference to drawings and examples.

In the present description, the singular forms "a", "an" and "the" are intended to include the plural forms as well, unless the context clearly indicates otherwise.

The present invention relates to a novel polymer compound represented by the following Structural Formula 1.

[Structural Formula 1]

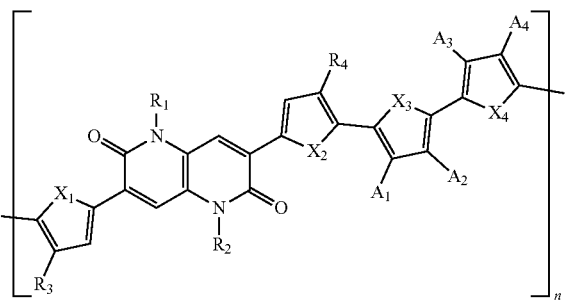

In Structural Formula 1 shown above, $X_1$, $X_2$, $X_3$, and $X_4$ are each independently O, S, Se, NH, or NR'

$R_1$, $R_2$, $R_3$, and $R_4$ are each independently an alkyl group having 1 to 50 carbon atoms, an aryl group having 6 to 50 carbon atoms, or —COOR', $A_1$, $A_2$, $A_3$, and $A_4$ are each independently H, F, CN, or —COOR', R' is an alkyl group having 1 to 50 carbon atoms or an aryl group having 6 to 50 carbon atoms, and n is an integer ranging from 1 to 1000.

$X_1$, $X_2$, $X_3$, and $X_4$ may each be independently O, S, Se, NH, or NR', and R' may be an alkyl group having 1 to 50 carbon atoms or an aryl group having 6 to 50 carbon atoms.

In a more detailed example, $X_1$, $X_2$, $X_3$, and $X_4$ may each be independently O or S.

In addition, $R_1$, $R_2$, $R_3$, and $R_4$ may each be independently an alkyl group having 1 to 50 carbon atoms, an aryl group having 6 to 50 carbon atoms, or —COOR', and R' may be an alkyl group having 1 to 50 carbon atoms or an aryl group having 6 to 50 carbon atoms.

In one example, $R_1$, $R_2$, $R_3$, $R_4$, and R' may each be independently an alkyl group having 1 to 46 carbon atoms, an alkyl group having 1 to 42 carbon atoms, an alkyl group having 1 to 38 carbon atoms, an alkyl group having 1 to 34 carbon atoms, an alkyl group having 1 to 30 carbon atoms, an alkyl group having 1 to 26 carbon atoms, or an alkyl group having 1 to 22 carbon atoms, or may each be independently an aryl group having 6 to 50 carbon atoms, or an aryl group having 6 to 50 carbon atoms, an aryl group having 6 to 50 carbon atoms, an aryl group having 6 to 50 carbon atoms, an aryl group having 6 to 44 carbon atoms, an aryl group having 6 to 38 carbon atoms, an aryl group having 6 to 32 carbon atoms, an aryl group having 6 to 26 carbon atoms, or an aryl group having 6 to 20 carbon atoms.

In a more detailed example, $R_1$, $R_2$, $R_3$, $R_4$, and R' may each be independently an alkyl group having 1 to 26 carbon atoms or an aryl group having 6 to 32 carbon atoms.

$R_1$, $R_2$, $R_3$, $R_4$ and R' are compositions capable of determining physical properties such as hydrophilicity or hydrophobicity of the polymer and preferably have a number of carbon atoms within an appropriate range.

In a more detailed example, $R_1$ and $R_2$ may each be independently an alkyl group having 5 to 14 carbon atoms. In addition, $R_3$ and $R_4$ may each be independently an alkyl group having 9 to 22 carbon atoms. Within the range described above, it is possible to secure the desired physical properties of a polymer, thereby increasing the light conversion efficiency of an organic solar cell or a perovskite solar cell.

$A_1$, $A_2$, $A_3$, and $A_4$ are independently H, F, CN, or —COOR', and may be H or F.

n is an integer ranging from 1 to 1000. In a more detailed example, n may be an integer ranging from 1 to 800, an integer ranging from 1 to 700, an integer ranging from 1 to 600, or an integer ranging from 1 to 500.

In addition, the present invention relates to a novel polymer compound represented by the following Structural Formula 2.

[Structural Formula 2]

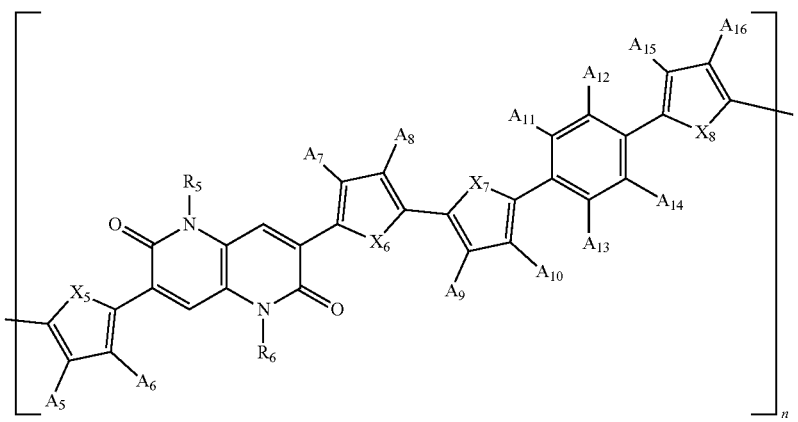

In Structural Formula 2 shown above, $X_5$, $X_6$, $X_7$, and $X_8$ are each independently O, S, Se, NH, or NR", $R_5$ and $R_6$ are each independently an alkyl group having 1 to 50 carbon atoms, an aryl group having 6 to 50 carbon atoms, or —(CH$_2$CH$_2$O)$_m$CH$_3$, $A_5$, $A_6$, $A_7$, $A_8$, $A_9$, $A_{10}$, $A_{11}$, $A_{12}$, $A_{13}$, $A_{14}$, $A_{15}$, and $A_{16}$ are each independently H, F, Cl, CN, —COOR", —OR", an alky group having 1 to 50 carbon atoms, or an aryl group having 6 to 50 carbon atoms, R" is each independently an alkyl group having 1 to 50 carbon atoms, an aryl group having 6 to 50 carbon atoms, or —(CH$_2$CH$_2$O)$_m$CH$_3$, m is an integer ranging from 1 to 20, and n is an integer ranging from 1 to 1000.

$X_5$, $X_6$, $X_7$, and $X_8$ may each be independently O, S, Se, NH, or NR", and R" may be an alkyl group having 1 to 50 carbon atoms or an aryl group having 6 to 50 carbon atoms.

In a more detailed example, $X_5$, $X_6$, $X_7$, and $X_8$ may each be independently O or S.

In addition, $R_5$ and $R_6$ may each be independently an alkyl group having 1 to 50 carbon atoms, an aryl group having 6 to 50 carbon atoms, or —(CH$_2$CH$_2$O)$_m$CH$_3$, and R" may each be independently an alkyl group having 1 to 50 carbon atoms, an aryl group having 6 to 50 carbon atoms, or —(CH$_2$CH$_2$O)$_m$CH$_3$.

In one example, $R_5$, $R_6$, and R" may each be independently an alkyl group having 1 to 46 carbon atoms, an alkyl group having 1 to 42 carbon atoms, an alkyl group having 1 to 38 carbon atoms, an alkyl group having 1 to 34 carbon atoms, an alkyl group having 1 to 30 carbon atoms, an alkyl group having 1 to 26 carbon atoms, or an alkyl group having 1 to 22 carbon atoms, or may each be independently an aryl group having 6 to 50 carbon atoms, an aryl group having 6 to 50 carbon atoms, an aryl group having 6 to 50 carbon atoms, an aryl group having 6 to 50 carbon atoms, an aryl group having 6 to 44 carbon atoms, an aryl group having 6 to 38 carbon atoms, an aryl group having 6 to 32 carbon atoms, an aryl group having 6 to 26 carbon atoms, or an aryl group having 6 to 20 carbon atoms.

In a more detailed example, $R_5$, $R_6$, and R" may each be independently an alkyl group having 1 to 26 carbon atoms or an aryl group having 6 to 32 carbon atoms.

In addition, $A_5$, $A_6$, $A_7$, $A_8$, $A_9$, $A_{10}$, $A_{11}$, $A_{12}$, $A_{13}$, $A_{14}$, $A_{15}$, and $A_{16}$ may each be independently H, F, Cl, CN, —COOR", —OR", an alkyl group having 1 to 50 carbon atoms, or an aryl group having 6 to 50 carbon atoms.

In one example, $A_5$, $A_6$, $A_7$, $A_8$, $A_9$, $A_{10}$, $A_{11}$, $A_{12}$, $A_{13}$, $A_{14}$, $A_{15}$, and $A_{16}$ may each be independently an alkyl group having 1 to 46 carbon atoms, an alkyl group having 1 to 42 carbon atoms, an alkyl group having 1 to 38 carbon atoms, an alkyl group having 1 to 34 carbon atoms, an alkyl group having 1 to 30 carbon atoms, an alkyl group having 1 to 26 carbon atoms, or an alkyl group having 1 to 22 carbon atoms, or may each be independently an aryl group having 6 to 50 carbon atoms, an aryl group having 6 to 50 carbon atoms, an aryl group having 6 to 50 carbon atoms, an aryl group having 6 to 50 carbon atoms, an aryl group having 6 to 44 carbon atoms, an aryl group having 6 to 38 carbon atoms, an aryl group having 6 to 32 carbon atoms, an aryl group having 6 to 26 carbon atoms, or an aryl group having 6 to 20 carbon atoms.

In a more detailed example, $A_5$, $A_6$, $A_7$, $A_8$, $A_9$, $A_{10}$, $A_{11}$, $A_{12}$, $A_{13}$, $A_{14}$, $A_{15}$, and $A_{16}$ may each be independently an alkyl group having 1 to 26 carbon atoms or an aryl group having 6 to 32 carbon atoms.

Meanwhile, $R_5$, $R_6$, $A_5$, $A_6$, $A_7$, and $A_8$ are compositions capable of determining physical properties hydrophilicity or hydrophobicity of the polymer and preferably have a number of carbon atoms within an appropriate range.

In a more detailed example, $R_5$ and $R_6$ may each be independently an alkyl group having 5 to 14 carbon atoms. In addition, $A_5$, $A_6$, $A_7$, and $A_8$ may each be independently an alkyl group having 9 to 22 carbon atoms. Within the above-described range, it is possible to apply to the desired physical properties of a polymer and a photo-active layer, thereby increasing the light conversion efficiency of an organic solar cell.

Meanwhile, in one example, any two of $A_{11}$, $A_{12}$, $A_{13}$, and $A_{14}$ may be substituted at ortho- or para-positions and may each be independently F or Cl. Preferably, any two of $A_{11}$, $A_{12}$, $A_{13}$, and $A_{14}$ may be F substituted at para-positions.

m is an integer ranging from 1 to 20. In a more detailed example, m may be an integer ranging from 1 to 16, an integer ranging from 1 to 14, an integer ranging from 1 to 12, or an integer ranging from 1 to 10.

n is an integer ranging from 1 to 1000. In a more detailed example, n may be an integer ranging from 1 to 800, an integer ranging from 1 to 700, an integer ranging from 1 to 600, or an integer ranging from 1 to 500.

Meanwhile, the polymer may be prepared from, for example, a 1,5-naphthyridine-2,6-dione compound represented by the following Formula 1.

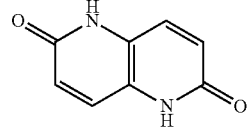

[Formula 1]

More specifically, the polymer of the present invention may be prepared through a Stille coupling reaction of the 1,5-naphthyridine-2,6-dione compound represented by Formula 1 shown above, but is not limited thereto.

In addition, the polymer may be prepared from, for example, a 6-methoxy-1,5-naphthyridine-2,6-dione compound represented by the following Formula 2.

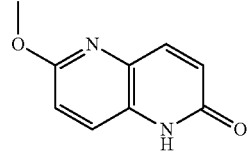

[Formula 2]

More specifically, the polymer of the present invention may be prepared through a Stille coupling reaction of the a 6-methoxy-1,5-naphthyridine-2(1H)-one compound represented by Formula 2 shown above, but is not limited thereto.

Meanwhile, the polymer of the present invention may be prepared from 1,5-naphthyridine-2,6-dione, in which a methoxy group that can be produced from 6-methoxy-1,5-naphthyridine-2(1H)-one is not substituted.

The polymer has excellent light absorption ability for sunlight. Also, the polymer has excellent crystallinity due to high planarity of molecular structure thereof and thus has high charge mobility. Therefore, when the polymer is used in a photo-active layer of an organic solar cell or a hole transport layer of a solar cell, it is possible to fabricate a solar cell having excellent light conversion efficiency.

In addition, the present invention relates to a polymer for a photo-active layer of an organic solar cell and an organic solar cell comprising the polymer.

The polymer according to the present invention is included in a photo-active layer of an organic solar cell and acts as an electron donor compound.

That is, the present invention relates to a polymer for a photo-active layer of an organic solar cell which is represented by the following Structural Formula 1.

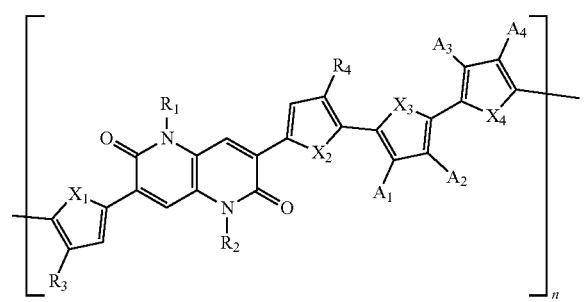

[Structural Formula 1]

In Structural Formula 1 shown above, $X_1$, $X_2$, $X_3$, and $X_4$ are each independently O, S, Se, NH, or NR', $R_1$, $R_2$, $R_3$, and $R_4$ are each independently an alkyl group having 1 to 50 carbon atoms, an aryl group having 6 to 50 carbon atoms, or —COOR', $A_1$, $A_2$, $A_3$, and $A_4$ are each independently H, F, CN, or —COOR', R' is an alkyl group having 1 to 50 carbon atoms or an aryl group having 6 to 50 carbon atoms, and n is an integer ranging from 1 to 1000.

As shown in Structural Formula 1 above, the polymer according to the present invention is a novel polymer compound with 1,5-naphthyridine-2,6-dione structure and has excellent light absorption rate for sunlight through the above chemical structure. Also, the polymer has high charge mobility due to high crystallinity and has an energy level suitable for the use as an electron donor compound. Thus, when the polymer described above is used as an electron donor compound in a photo-active layer of the organic solar cell, it is possible to fabricate the organic solar cell with high short-circuit current and fill factor and excellent light conversion efficiency.

$X_1$, $X_2$, $X_3$, and $X_4$ may each be independently O, S, Se, NH, or NR', and R' may be an alkyl group having 1 to 50 carbon atoms or an aryl group having 6 to 50 carbon atoms.

In a more detailed example, $X_1$, $X_2$, $X_3$, and $X_4$ may each be independently O or S.

In addition, $R_1$, $R_2$, $R_3$, and $R_4$ may each be independently an alkyl group having 1 to 50 carbon atoms, an aryl group having 6 to 50 carbon atoms, or —COOR', and R' may be an alkyl group having 1 to 50 carbon atoms or an aryl group having 6 to 50 carbon atoms.

In one example, $R_1$, $R_2$, $R_3$, $R_4$, and R' may each be independently an alkyl group having 1 to 46 carbon atoms, an alkyl group having 1 to 42 carbon atoms, an alkyl group having 1 to 38 carbon atoms, an alkyl group having 1 to 34 carbon atoms, an alkyl group having 1 to 30 carbon atoms, an alkyl group having 1 to 26 carbon atoms, or an alkyl group having 1 to 22 carbon atoms, or may each be independently an aryl group having 6 to 50 carbon atoms, an aryl group having 6 to 50 carbon atoms, an aryl group having 6 to 50 carbon atoms, an aryl group having 6 to 50 carbon atoms, an aryl group having 6 to 44 carbon atoms, an aryl group having 6 to 38 carbon atoms, an aryl group having 6 to 32 carbon atoms, an aryl group having 6 to 26 carbon atoms, or an aryl group having 6 to 20 carbon atoms.

In a more detailed example, $R_1$, $R_2$, $R_3$, $R_4$, and R' may each be independently an alkyl group having 1 to 26 carbon atoms or an aryl group having 6 to 32 carbon atoms.

$R_1$, $R_2$, $R_3$, $R_4$, and R' are compositions capable of determining physical properties such as hydrophilicity or hydrophobicity of the polymer and preferably have a number of carbon atoms within an appropriate range.

In a more detailed example, $R_1$ and $R_2$ may each be independently an alkyl group having 5 to 14 carbon atoms. Also, $R_3$ and $R_4$ may each be independently an alkyl group having 9 to 22 carbon atoms. Within the above-described range, it is possible to apply to the desired physical properties of the polymer and the photo-active layer, thereby increasing the light conversion efficiency of the organic solar cell.

$A_1$, $A_2$, $A_3$, and $A_4$ may each be independently H, F, CN, or —COOR', and may be, for example, H or F.

n is an integer ranging from 1 to 1000. In a more detailed example, n is an integer ranging from 1 to 800, an integer ranging from 1 to 700, an integer ranging from 1 to 600, or an integer ranging from 1 to 500.

The polymer described above exhibits excellent light absorption rate for visible light.

In one example, the polymer may have a light absorption coefficient of $5 \times 10^4$ cm$^{-1}$ or more at a maximum light absorption wavelength within wavelengths from 380 nm to 1000 nm. In another example, the polymer may have a light absorption coefficient of $1 \times 10^5$ cm$^{-1}$ or more, $1.5 \times 10^5$ cm$^{-1}$ or more, $2 \times 10^5$ cm$^{-1}$ or more, $2.5 \times 10^5$ cm$^{-1}$ or more, $3 \times 10^5$ cm$^{-1}$ or more, $3.5 \times 10^5$ cm$^{-1}$ or more, $4 \times 10^5$ cm$^{-1}$ or more, or $4.5 \times 10^5$ cm$^{-1}$ or more at a maximum light absorption wavelength within wavelengths from 380 nm to 1000 nm. The upper limit of the light absorption coefficient at the maximum light absorption wavelength within wavelengths from 380 nm to 1000 nm may be, for example, $5.0 \times 10^5$ cm$^{-1}$ or less.

The polymer of the present invention is included in a photo-active layer of the organic solar cell and acts as an electron donor compound. Thus, the polymer may have a suitable energy level.

In one example, the polymer may have a HOMO energy level in a range from −5.0 eV to −5.6 eV and a LUMO energy level in a range from −3.4 eV to −4.0 eV. When the polymer having the energy level within the above-described range is used, exciton separation and charge transfer may easily take place in the photo-active layer.

The present invention also relates to an organic solar cell comprising the polymer described above. The organic solar cell has high short-circuit current and fill factor and excellent light conversion efficiency.

The organic solar cell of the present invention includes a first electrode and a second electrode disposed facing each other and a photo-active layer disposed between the first electrode and the second electrode, wherein the photo-active layer is characterized by including a polymer represented by the following Structural Formula 1.

[Structural Formula 1]

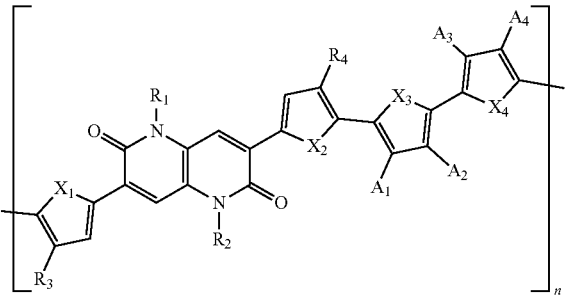

In Structural Formula 1, $X_1$, $X_2$, $X_3$, and $X_4$ are each independently O, S, Se, NH, or NR', $R_1$, $R_2$, $R_3$, and $R_4$ are each independently an alkyl group having 1 to 50 carbon atoms, an aryl group having 6 to 50 carbon atoms, or —COOR', $A_1$, $A_2$, $A_3$, and $A_4$ are each independently H, F, CN, or —CROO', R' is an alkyl group having 1 to 50 carbon atoms or an aryl group having 6 to 50 carbon atoms, and n is an integer ranging from 1 to 1000.

The organic solar cell of the present invention includes in the photo-active layer the polymer, represented by Structural Formula 1 described above, as an electron donor compound and may hence have high short-circuit current and fill factor and excellent light conversion efficiency.

In addition, the present invention relates to a polymer for a photo-active layer of an organic solar cell which is represented by the following Structural Formula 2.

[Structural Formula 2]

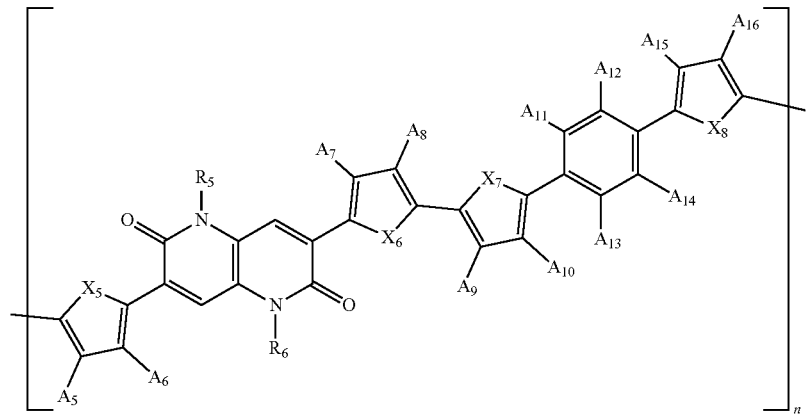

In Structural Formula 2 shown above, $X_5$, $X_6$, $X_7$, and $X_8$ are each independently O, S, Se, NH, or NR", $R_5$ and $R_6$ are each independently an alkyl group having 1 to 50 carbon atoms, an aryl group having 6 to 50 carbon atoms, or —$(CH_2CH_2O)_mCH_3$, $A_5$, $A_6$, $A_7$, $A_8$, $A_9$, $A_{10}$, $A_{11}$, $A_{12}$, $A_{13}$, $A_{14}$, $A_{15}$, and $A_{16}$ are each independently H, F, Cl, CN, —COOR", —OR", an alkyl group having 1 to 50 carbon atoms, or an aryl group having 6 to 50 carbon atoms, R" is each independently an alkyl group having 1 to 50 carbon atoms, an aryl group having 6 to 50 carbon atoms, or —$(CH_2CH_2O)_mCH_3$, m is an integer ranging from 1 to 20, and n is an integer ranging from 1 to 1000.

As shown in Structural Formula 2 above, the polymer according to the present invention is a novel polymer compound with 1,5-naphthyridine-2,6-dione structure, which has an excellent light absorption rate for sunlight through the above-described chemical structure. In addition, the polymer has high charge mobility due to excellent crystallinity and has an energy level suitable for the use as an electron donor compound. Therefore, when the polymer is used as an electron donor compound in a photo-active layer of an organic solar cell, it is possible to fabricate the organic solar cell with high short-circuit current and fill factor and excellent light conversion efficiency.

$X_5$, $X_6$, $X_7$, and $X_8$ may each be independently O, S, Se, NH, or NR", and R" may be an alkyl group having 1 to 50 carbon atoms or an aryl group having 6 to 50 carbon atoms.

In a more detailed example, $X_5$, $X_6$, $X_7$, and $X_8$ may each be O or S.

Also, $R_5$ and $R_6$ may each be independently an alkyl group having 1 to 50 carbon atoms, an aryl group having 6 to 50 carbon atoms, or —$(CH_2CH_2O)_mCH_3$, and R" may each be independently an alkyl group having 1 to 50 carbon atoms, an aryl group having 6 to 50 carbon atoms, or —$(CH_2CH_2O)_mCH_3$.

In one example, $R_5$, $R_6$, and R" may each be independently an alkyl group having 1 to 46 carbon atoms, an alkyl group having 1 to 42 carbon atoms, an alkyl group having 1 to 38 carbon atoms, an alkyl group having 1 to 34 carbon atoms, an alkyl group having 1 to 30 carbon atoms, an alkyl group having 1 to 26 carbon atoms, or an alkyl group having 1 to 22 carbon atoms, or may each be independently an aryl group having 6 to 50 carbon atoms, an aryl group having 6 to 50 carbon atoms, an aryl group having 6 to 50 carbon atoms, an aryl group having 6 to 50 carbon atoms, an aryl group having 6 to 44 carbon atoms, an aryl group having 6 to 38 carbon atoms, an aryl group having 6 to 32 carbon atoms, an aryl group having 6 to 26 carbon atoms, or an aryl group having 6 to 20 carbon atoms.

In a detailed example, $R_5$, $R_6$, and R" may each be independently an alkyl group having 1 to 26 carbon atoms or an aryl group having 6 to 32 carbon atoms.

In addition, $A_5$, $A_6$, $A_7$, $A_8$, $A_9$, $A_{10}$, $A_{11}$, $A_{12}$, $A_{13}$, $A_{14}$, $A_{15}$, and $A_{16}$ may each be independently H, F, Cl, CN, —COOR", —OR", an alkyl group having 1 to 50 carbon atoms, or an aryl group having 6 to 50 carbon atoms.

In one example, $A_5$, $A_6$, $A_7$, $A_8$, $A_9$, $A_{10}$, $A_{11}$, $A_{12}$, $A_{13}$, $A_{14}$, $A_{15}$, and $A_{16}$ may each be independently an alkyl group having 1 to 46 carbon atoms, an alkyl group having 1 to 42 carbon atoms, an alkyl group having 1 to 38 carbon atoms, an alkyl group having 1 to 34 carbon atoms, an alkyl group having 1 to 30 carbon atoms, an alkyl group having 1 to 26 carbon atoms, or an alkyl group having 1 to 22 carbon atoms, or may each be independently an aryl group having 6 to 50 carbon atoms, independently an aryl group having 6 to 50 carbon atoms, independently an aryl group having 6 to 50 carbon atoms, independently an aryl group having 6 to 50 carbon atoms, an aryl group having 6 to 44 carbon atoms, an aryl group having 6 to 38 carbon atoms, an aryl group having 6 to 32 carbon atoms, an aryl group having 6 to 26 carbon atoms, or an aryl group having 6 to 20 carbon atoms.

In a detailed example, $A_5$, $A_6$, $A_7$, $A_8$, $A_9$, $A_{10}$, $A_{11}$, $A_{12}$, $A_{13}$, $A_{14}$, $A_{15}$, and $A_{16}$ may each be independently an alkyl group having 1 to 26 carbon atoms or an aryl group having 6 to 32 carbon atoms.

$R_5$, $R_6$, $A_5$, $A_6$, $A_7$, and $A_8$ are compositions capable of determining physical properties such as hydrophilicity or hydrophobicity of the polymer and preferably have a number of carbon atoms within an appropriate range.

In a more detailed example, $R_5$ and $R_6$ may each be independently an alky group having 5 to 14 carbon atoms. In addition, $A_5$, $A_6$, $A_7$, and $A_8$ may each be independently an alkyl group having 9 to 22 carbon atoms. With the range described above, it is possible to apply to desired physical properties of the polymer and the photo-active layer, thereby increasing the light conversion efficiency of the organic solar cell.

Meanwhile, in one example, any two of $A_{11}, A_{12}, A_{13}$, and $A_{14}$ may be substituted at ortho- or para-positions and may The organic solar cell of the present invention includes a first electrode and a second electrode disposed facing each other and a photo-active layer disposed between the first electrode and the second electrode, wherein the photo-active layer is characterized by including a polymer represented by the following Structural Formula 2.

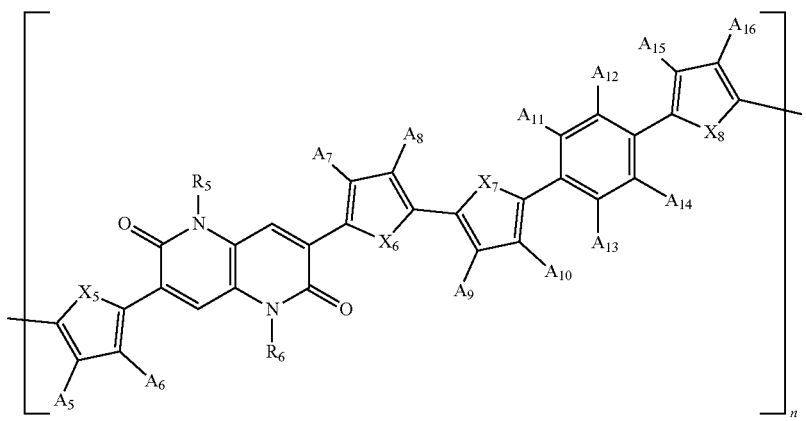

[Structural Formula 2]

each be independently F or Cl. Preferably, any two of $A_{11}$, $A_{12}$, $A_{13}$, and $A_{14}$ may be F substituted at para-positions.

m is an integer ranging from 1 to 20. In a more detailed example, m may be an integer ranging from 1 to 16, an integer ranging from 1 to 14, an integer ranging from 1 to 12, or an integer ranging from 1 to 10.

n is an integer ranging from 1 to 1000. In a more detailed example, n may be an integer ranging from 1 to 800, an integer ranging from 1 to 700, an integer ranging from 1 to 600, or an integer ranging from 1 to 500.

The polymer described above exhibits an excellent light absorption rate for visible light.

In one example, the polymer may have a light absorption coefficient of $1.5 \times 10^5$ cm$^{-1}$ or more at a maximum light absorption wavelength within wavelengths from 300 nm to 1000 nm. In another example, the polymer may have a light absorption coefficient of $1.5 \times 10^5$ cm$^{-1}$ or more, $1.5 \times 10^5$ cm$^{-1}$ or more, $2 \times 10^5$ cm$^{-1}$ or more, $2.5 \times 10^5$ cm$^{-1}$ or more, $3 \times 10^5$ cm$^{-1}$ or more, $3.5 \times 10^5$ cm$^{-1}$ or more, $4 \times 10^5$ cm$^{-1}$ or more, or $4.5 \times 10^5$ cm$^{-1}$ or more at the maximum light absorption wavelength within wavelengths from 380 nm to 1000 nm. The upper limit of the light absorption coefficient at the maximum light absorption wavelength within the wavelengths from 380 nm to 1000 nm may be, for example, $5.0 \times 10^5$ cm$^{-1}$ or less.

The polymer of the present invention is included in the photo-active layer of the organic solar cell and acts as an electron donor compound. Therefore, the polymer may have a suitable energy level.

In one example, the polymer may have a HOMO energy level in a range from −5.0 eV to −5.6 eV and a LUMO energy level in a range from −3.4 eV to −4.0 eV. When the polymer having the energy level within the range described above is used, exciton separation and charge transfer may easily take place in the photo-active layer.

The present invention also relates to an organic solar cell comprising the polymer described above. The organic solar cell has high short-circuit current and fill factor and excellent light conversion efficiency.

In Structural Formula 2 shown above, $X_5$, $X_6$, $X_7$, and $X_8$ are each independently O, S, Se, NH, or NR″, $R_5$ and $R_6$ are each independently an alkyl group having 1 to 50 carbon atoms, an aryl group having 6 to 50 carbon atoms, or —(CH$_2$CH$_2$O)$_m$CH$_3$, $A_5$, $A_6$, $A_7$, $A_8$, $A_9$, $A_{10}$, $A_{11}$, $A_{12}$, $A_{13}$, $A_{14}$, $A_{15}$, and $A_{16}$ are each independently H, F, Cl, CN, —COOR″, —OR″, an alkyl group having 1 to 50 carbon atoms, or an aryl group having 6 to 50 carbon atoms, R″ is each independently an alkyl group having 1 to 50 carbon atoms, an aryl group having 6 to 50 carbon atoms, or —(CH$_2$CH$_2$O)$_m$CH$_3$, m is an integer ranging from 1 to 20, and n is an integer ranging from 1 to 1000.

The organic solar cell of the present invention includes in the photo-active layer the polymer, represented by Structural Formula 2 described above, as an electron donor and may hence have high short-circuit current and fill factor and excellent light conversion efficiency.

In particular, an energy level may be adjusted by introducing a benzene ring to the above Structural Formula 2. Specifically, when a benzene ring is added, a band gap is increased because the HOMO level becomes lower and the LUMO level becomes higher. That is, due to the deeper HOMO level, a voltage value Voc of a solar cell device may be increased.

In addition, an element having high electronegativity, for example, fluorine (F) may be substituted in the benzene ring to be introduced. As a result, the HOMO level and the LUMO level may be further lowered, and the voltage value Voc of the solar cell device may be further increased. Also, the introduction of the fluorine may cause an intra-molecular interaction between elemental sulfur of adjacent thiophene and fluorine-sulfur molecules, thereby increasing co-planarity between molecules. Accordingly, π-π interactions between polymer main chains may be enhanced.

Since fluorine is the most electronegative element, it is possible to form a strong dipole. The strong dipole may cause a dipole-dipole interaction, which may enhance an interaction between the main chains of the polymer. The enhanced interaction between the main chains of the polymer may increase the hole mobility of the polymer, and even when the photo-active layer becomes thicker, effective hole movement is possible due to the increased hole mobility. Thus, the maximum light absorption may be achieved due to the thicker thickness of the photo-active layer, thereby improving the efficiency of the organic solar cell to a level of 10%.

Also, according to one embodiment of the present invention, a crystalline coherence length (CCL) of the polymer for a photo-active layer of an organic solar cell which is represented by the above Structural Formula 2 may be in a range from 18 Å to 30 Å. The smaller the CCL, the wider the interface and the more current is generated at the interface. That is, there is an effect of improving the efficiency of the organic solar cell.

FIG. 1 is a schematic diagram illustrating a structure of an organic solar cell according to the present invention.

As illustrated in FIG. 1, the organic solar cell 1 according to the present invention includes a first electrode 100 and a second electrode 200 disposed facing each other and a photo-active layer 300 disposed between the first electrode 100 and the second electrode 200. In addition, the photo-active layer 300 is characterized by including a polymer represented by Structural Formula 1 or 2 shown above.

The first electrode according to the present invention may be positioned, for example, as shown in FIG. 1, in a direction of incident sunlight, and the second electrode may be positioned relatively farther away than the first electrode in the direction of incident sunlight.

In one example, the first electrode may be a transparent electrode. Examples of the type of the first electrode may include, for example, a metal such as vanadium, chromium, copper, zinc, or gold, or an alloy thereof; a metal oxide such as zinc oxide, indium oxide, indium tin oxide (ITO), or indium zinc oxide (IZO); a combination of a metal and an oxide, such as $ZnO:Al$ or $SnO_2:Sb$; a conductive polymer such as PEDOT:PSS, polypyrrole, or polyaniline, or the like, but are not limited thereto.

The first electrode may include, for example, a two-layer structure in which the above-mentioned materials form individual layers.

In a detailed example, the first electrode may be formed of an ITO layer and a PEDOT:PSS conductive polymer layer sequentially in the direction of incident sunlight.

The first electrode may have a transmittance of 80% or more for wavelengths from 380 nm to 700 nm. As such, a transparent material with an excellent transmittance may be used as the first electrode.

A method of forming the first electrode is not particularly limited, and a well-known wet and dry coating method, such as sputtering, E-beam, thermal deposition, spin coating, screen printing, inkjet printing, doctor blade, gravure printing, or the like may be used without limitation.

The first electrode may be formed on, for example, a substrate. That is, as shown in FIG. 1, the organic solar cell 1 according to the present invention may further include a substrate 400.

That is, the organic solar cell according to the present invention may further include the substrate positioned on a surface of the first electrode opposite to a surface on which the photo-active layer is present.

The substrate may be appropriately selected by taking into account transparency, surface smoothness, ease of handling, water repellency, and the like.

In one example, examples of the substrate may include a glass substrate, a transparent plastic substrate, and the like, and examples of the plastic substrate may include, for example, polyethylene terephthalate (PET), polyethylene naphthalate (PEN), polypropylene (PP), polyimide (PI), or triacetyl cellulose (TAC), but are not limited thereto.

The organic solar cell of the present invention includes the second electrode disposed facing the first electrode. The second electrode may be, for example, a metal electrode.

The metal electrode may include, for example, a metal such as magnesium, calcium, sodium, potassium, titanium, indium, yttrium, lithium, gadolinium, aluminum, silver, tin and lead, or an alloy thereof, or a material of a multi-layer structure such as $LiF/Al$, $LiO_2/Al$, $LiF/Fe$, $Al:Li$, $Al:BaF_2$, or $Al:BaF_2:Ba$, but is not limited thereto.

In a detailed example, the second electrode may be of a multi-layer structure in which the above-described materials are individually present in each layer.

The second electrode may be formed by being deposited by, for example, a thermal deposition method or the like.

The organic solar cell of the present invention further includes the photo-active layer disposed between the first electrode and the second electrode. The photo-active layer includes a polymer represented by Structural Formula 1 or 2 shown above. The polymer represented by Structural Formula 1 or 2 shown above acts as an electron donor compound.

Meanwhile, the photo-active layer according to the present invention may have a bulk-heterojunction structure.

Specifically, the photo-active layer may be a bulk-heterojunction layer that further includes an electron acceptor compound.

The electron acceptor compound may be any one selected from the group consisting of, for example, fullerene, fullerene derivatives, carbon nanotubes, carbon nanotube derivatives, bathocuproine, semiconductor elements, semiconductor compounds, and a combination thereof.

In a more detailed example, examples of the electron acceptor compound may include PCBM, $PC_{71}BM$, PCBCR, perylene, PBI, PTCBI, and the like, but are not limited thereto.

The photo-active layer may be formed through a wet coating process of a mixture solution containing the polymer compound represented by the above-described Structural Formula 1 or 2 and the electron acceptor compound. When the photo-active layer is prepared through the above-described process, the polymer compound represented by Structural Formula 1 or 2 which acts as an electron donor compound and the above-described electron acceptor compound may form a bulk-heterojunction state in which they are randomly mixed.

The polymer compound represented by Structural Formula 1 or 2 above and the electron acceptor compound may be included in the photo-active layer in a ratio (w/w) of, for example, 1:10 to 10:1.

The organic solar cell of the present invention includes in the photo-active layer the polymer with high planarity and excellent crystallinity which is represented by Structural Formula 1 or 2 above and may hence have excellent hole mobility.

In one example, the organic solar cell may have a hole mobility of $1 \times 10^{-4}$ $cm^2$ $V^{-1}s^{-1}$ or more, $5 \times 10^{-4}$ $cm^2$ $V^{-1}s^{-1}$ or more, $1 \times 10^{-3}$ $cm^2$ $V^{-1}s^{-1}$ or more, $5 \times 10^{-3}$ $cm^2$ $V^{-1}s^{-1}$ or more, or $1 \times 10^{-2}$ $cm^2V^{-1s-1}$ or more. The upper limit of the hole mobility may be, for example, $5 \times 10^{-2}$ $cm^2$ $V^{-1s-1}$ or less.

The organic solar cell according to the present invention includes in the photo-active layer the polymer represented by Structural Formula 1 or 2 above as an electron donor compound and may hence excellent light conversion efficiency.

In one example, the organic solar cell of the present invention may have a light conversion efficiency (%) of 8% or more. In another example, the organic solar cell may have a light conversion efficiency (%) of 9% or more or 9.5% or more. In still another example, the organic solar cell may have a light conversion efficiency (%) of 9.5% or more or 10% or more.

Meanwhile, the present invention relates to a polymer for a hole transport layer of a perovskite solar cell and a perovskite solar cell comprising the polymer.

The polymer according to the present invention is included in a hole transport layer of the perovskite solar cell and serves to transport holes produced in a perovskite layer to an electrode.

That is, the present invention relates to a polymer for a hole transport layer of a perovskite solar cell which is represented by Structural Formula 1 shown below.

[Structural Formula 1]

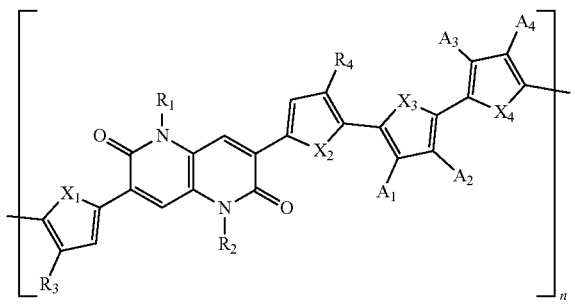

In Structural Formula 1 shown above, $X_1$, $X_2$, $X_3$, and $X_4$ are each independently O, S, Se, NH, or NR', $R_1$, $R_2$, $R_3$, and $R_4$ are each independently an alkyl group having 1 to 50 carbon atoms, an aryl group having 6 to 50 carbon atoms, or —COOR', $A_1$, $A_2$, $A_3$, and $A_4$ are each independently H, F, CN, or —COOR', R' is an alkyl group having 1 to 50 carbon atoms or an aryl group having 6 to 50 carbon atoms, and n is an integer ranging from 1 to 1000.

As shown in Structural Formula 1 above, the polymer according to the present invention is a novel polymer compound with a 1,5-naphthyridine-2,6-dione structure, which has excellent crystallinity through the above-described chemical structure and thereby has high charge mobility. Thus, when the polymer is used as a hole transport material in a hole transport layer of a perovskite solar cell, it is possible to fabricate a perovskite solar cell with high short-circuit current and fill factor and excellent light conversion efficiency without including an additive and with improved service life characteristic without deterioration of efficiency.

$X_1$, $X_2$, $X_3$, and $X_4$ may each be independently O, S, Se, NH, or NR', and R' may be an alkyl group having 1 to 50 carbon atoms or an aryl group having 6 to 50 carbon atoms.

In a more detailed example, $X_1$, $X_2$, $X_3$, and $X_4$ may each be independently O or S.

In addition, $R_1$, $R_2$, $R_3$, and $R_4$ may each be independently an alkyl group having 1 to 50 carbon atoms, an aryl group having 6 to 50 carbon atoms, or —COOR', and R' may be an alkyl group having 1 to 50 carbon atoms or an aryl group having 6 to 50 carbon atoms.

In one example, $R_1$, $R_2$, $R_3$, $R_4$, and R' may each be independently an alkyl group having 1 to 46 carbon atoms, an alkyl group having 1 to 42 carbon atoms, an alkyl group having 1 to 38 carbon atoms, an alkyl group having 1 to 34 carbon atoms, an alkyl group having 1 to 30 carbon atoms, an alkyl group having 1 to 26 carbon atoms, or an alkyl group having 1 to 22 carbon atoms, or may each be independently an aryl group having 6 to 50 carbon atoms, an aryl group having 6 to 50 carbon atoms, an aryl group having 6 to 50 carbon atoms, an aryl group having 6 to 50 carbon atoms, an aryl group having 6 to 44 carbon atoms, an aryl group having 6 to 38 carbon atoms, an aryl group having 6 to 32 carbon atoms, an aryl group having 6 to 26 carbon atoms, or an aryl group having 6 to 20 carbon atoms.

In a detailed example, $R_1$, $R_2$, $R_3$, $R_4$, and R' may each be independently an alkyl group having 1 to 26 carbon atoms or an aryl group having 6 to 32 carbon atoms.

$R_1$, $R_2$, $R_3$, $R_4$, and R' are compositions capable of determining physical properties such as hydrophilicity or hydrophobicity of the polymer and preferably have a number of carbon atoms within an appropriate range.

In a more detailed example, $R_1$ and $R_2$ may each be independently an alkyl group having 5 to 14 carbon atoms. In addition, $R_3$ and $R_4$ may each be independently an alkyl group having 9 to 22 carbon atoms. Within the range described above, it is possible to apply to desired physical properties of the polymer and the hole transport layer, thereby increasing the light conversion efficiency of the perovskite solar cell.

$A_1$, $A_2$, $A_3$, and $A_4$ may each be independently H, F, CN, or —COOR' and may be, for example, H or F.

n is an integer ranging from 1 to 1000. In a more detailed example, n may be an integer ranging from 1 to 800, an integer ranging from 1 to 700, an integer ranging from 1 to 600, or an integer ranging from 1 to 500.

The polymer of the present invention is included in the hole transport layer of the perovskite solar cell and acts as a hole transport material. Thus, the polymer has excellent planarity and crystallinity, and may thus have high hole mobility.

In one example, a CCL may have a range from 18 Å to 30 Å, and preferably a range from 25 Å to 30 Å. When the polymer having a CCL within the above range is used, an interface becomes wider and current generated at the interface is increased. That is, the efficiency of the perovskite solar cell may be improved.

The perovskite solar cell of the present invention includes a first electrode and a second electrode disposed facing each other and an electron transport layer, a perovskite layer, and a hole transport layer are stacked between the first and second electrodes, wherein the hole transport layer is characterized by including a polymer represented by the following Structural Formula 1.

[Structural Formula 1]

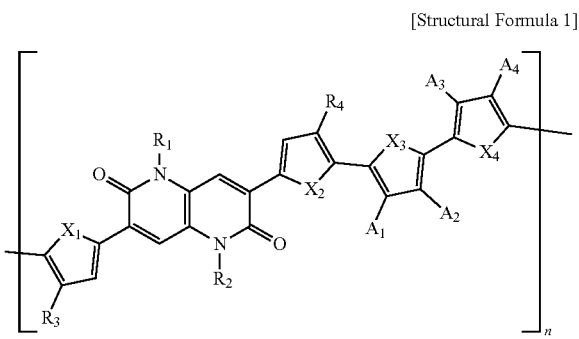

In Structural Formula 1 shown above, $X_1$, $X_2$, $X_3$, and $X_4$ are each independently O, S, Se, NH, or NR', $R_1$, $R_2$, $R_3$, and $R_4$ are each independently an alkyl group having 1 to 50 carbon atoms, an aryl group having 6 to 50 carbon atoms, or —COOR', $A_1$, $A_2$, $A_3$, and $A_4$ are each independently H, F, CN, or —COOR', R' is an alkyl group having 1 to 50 carbon atoms or an aryl group having 6 to 50 carbon atoms, and n is an integer ranging from 1 to 1000.

The perovskite solar cell of the present invention includes the polymer, which is represented by Structural Formula 1 described above, as a hole transport material in the hole transport layer and thereby may have high hole mobility and excellent light conversion efficiency.

A hole transport material of a conventionally used perovskite solar cell has low hole mobility and hence uses additives to compensate the low hole mobility. However, the additives are disadvantageous in that they have strong hygroscopicity to moisture and, in some cases, are strong bases having high reactivity, so that the service life of a device is quickly reduced.

In contrast, the polymer according to the present invention, which is represented by Structural Formula 1, has high hole mobility without using an additive, thereby improving efficiency and service life of the perovskite solar cell.

FIG. 17 is a schematic diagram illustrating a structure of a perovskite solar cell according to the present invention.

As shown in FIG. 17, the perovskite solar cell 2 according to the present invention includes a first electrode 600 and a second electrode 700 disposed facing each other, and an electron transport layer 820, a perovskite layer 840, and a hole transport layer 860 which are disposed between the first electrode 600 and the second electrode 700. In addition, the hole transport layer 860 is characterized by comprising the polymer represented by Structural Formula 1 above.

The first electrode according to the present invention may be positioned, for example, as shown in FIG. 17, in a direction of incident sunlight, and the second electrode may be positioned relatively farther away than the first electrode in the direction of incident sunlight.

In one example, the first electrode may be a transparent electrode. Examples of the type of the first electrode may include, for example, a metal such as vanadium, chromium, copper, zinc, or gold, or an alloy thereof; a metal oxide such as zinc oxide, indium oxide, ITO, fluorine-tin oxide (FTO), or IZO; a combination of a metal and an oxide, such as ZnO:Al or $SnO_2$:Sb; a conductive polymer such as PEDOT: PSS, polypyrrole, or polyaniline, or the like, but are not limited thereto.

The first electrode may include, for example, a two-layer structure in which the above-mentioned materials form individual layers.

In a detailed example, the first electrode may be formed of an ITO layer and a PEDOT:PSS conductive polymer layer sequentially in the direction of incident sunlight.

The first electrode may have a transmittance of 80% or more for wavelengths from 380 nm to 700 nm. As such, a transparent material with an excellent transmittance may be used as the first electrode.

A method of forming the first electrode is not particularly limited, and a well-known wet and dry coating method, such as sputtering, E-beam, thermal deposition, spin coating, screen printing, inkjet printing, doctor blade, gravure printing, or the like may be used without limitation.

The first electrode may be formed on, for example, a substrate. That is, as shown in FIG. 17, the perovskite solar cell 2 according to the present invention may further include a substrate 900.

That is, the perovskite solar cell according to the present invention may further include the substrate positioned on a surface of the first electrode opposite to a surface on which the photo-active layer 860 is present.

The substrate may be appropriately selected by taking into account transparency, surface smoothness, ease of handling, water repellency, and the like.

In one example, examples of the substrate may include a glass substrate, a transparent plastic substrate, and the like, and examples of the plastic substrate may include, for example, polyethylene terephthalate (PET), polyethylene naphthalate (PEN), polypropylene (PP), polyimide (PI), or triacetyl cellulose (TAC), but are not limited thereto.

The perovskite solar cell of the present invention includes the second electrode disposed facing the first electrode. The second electrode may be, for example, a metal electrode.

The metal electrode may include, for example, a metal such as magnesium, calcium, sodium, potassium, titanium, indium, yttrium, lithium, gadolinium, aluminum, silver, gold, tin and lead, or an alloy thereof, or a material of a multi-layer structure such as Al:$BaF_2$:Ba, $MoO_3$/Ag, or $MoO_3$/Au, but is not limited thereto.

In a detailed example, the second electrode may be of a multi-layer structure in which the above-described materials are individually present in each layer.

The second electrode may be formed by being deposited by, for example, a thermal deposition method or the like.

The perovskite solar cell of the present invention includes the electron transport layer 820, the perovskite layer 840, and the hole transport layer 860 which are disposed between the first electrode and the second electrode. The hole transport layer 860 includes the polymer represented by Structural Formula 1 above. The polymer represented by Structural Formula 1 acts as a hole transport material.

Meanwhile, the electron transport layer 820 according to the present invention may be a metal oxide and an electron acceptor organic semiconductor compound.

Specifically, the electron transport layer may include titanium oxide ($TiO_2$), sol-gel tin oxide ($SnO_2$), sol-gel zinc oxide (ZnO), nanoparticle tin oxide (NP—$SnO_2$), nanoparticle zinc oxide (NP—ZnO), fullerene ($C_{60}$, $C_{70}$), fullerene derivatives ($PC_{61}BM$, $PC_{71}BM$, $ICB_{60}A$, $ICB_{70}A$), non-fullerene organic semiconductor electron acceptor compounds, and a composite layer in a metal oxide/organic semiconductor electron acceptor form.

The electron acceptor compound may be one selected from the multi-layer electron acceptor layer (metal oxide/ organic semiconductor) group consisting of, for example, fullerene, fullerene derivatives, bathocuproine, semiconductor elements, semiconductor compounds, $TiO_2$, ZnO, and a combination thereof.

In a more detailed example, examples of the electron acceptor compound may include $PC_{61}BM$, $PC_{71}BM$, PCBCR, perylene, PBI, PTCBI, and the like, but are not limited thereto.

The perovskite solar cell of the present invention includes in the hole transport layer 860 the polymer with high planarity and excellent crystallinity which is represented by Structural Formula 1 above and may hence have excellent hole mobility.

In one example, the perovskite solar cell may have a hole mobility of $7 \times 10^{-4}$ $cm^2$ $V^{-1s-1}$ or more, $9 \times 10^{-4}$ $cm^2$ $V^{-1s-1}$ or more, $1 \times 10^{-3}$ $cm^2$ $V^{-1s-1}$ or more, or $3 \times 10^{-3}$ $cm^2$ $V^{-1s-1}$ or more. The upper limit of the hole mobility may be, for example, $5 \times 10^{-3}$ $cm^2$ $V^{-1s-1}$ or less.

The perovskite solar cell according to the present invention includes in the hole transport layer the polymer represented by Structural Formula 1 as a hole transport material, and may hence have excellent light conversion efficiency.

In one example, the perovskite solar cell of the present invention may have a light conversion efficiency (%) of 14% or more. In another example, the perovskite solar cell may have a light conversion efficiency (%) of 16% or more or 18% or more.

Hereinafter, preparation of a novel polymer compound according to the present invention, an organic solar cell including the polymer compound, and a perovskite solar cell including the polymer compound will be described in more detail with reference to examples. However, the following examples are merely illustrative, and it is apparent to those skilled in the art that these examples are not intended to limit the technical spirit of the present invention.

Preparation Example 1. Synthesis of Novel Polymer Having 1,5-naphthyridine-2,6-dione Structure (PNTDT-2F2T)

A novel polymer (PNTDT-2F2T) was synthesized according to the following Synthesis Mechanism 1.

[Synthesis Mechanism 1]

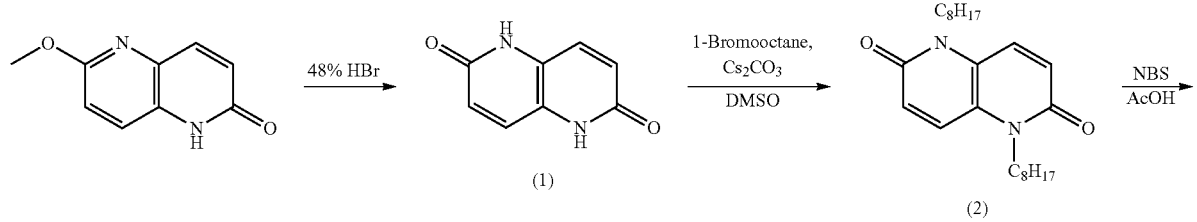

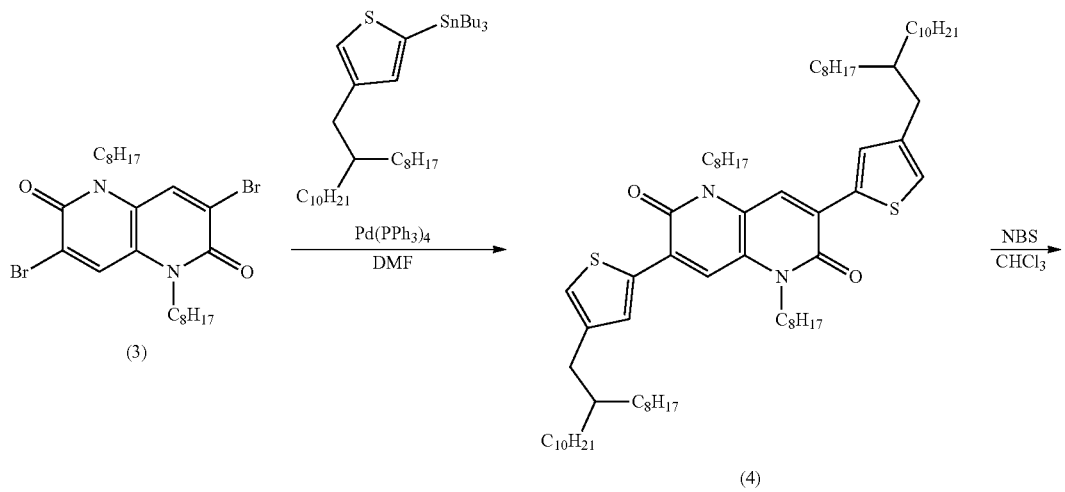

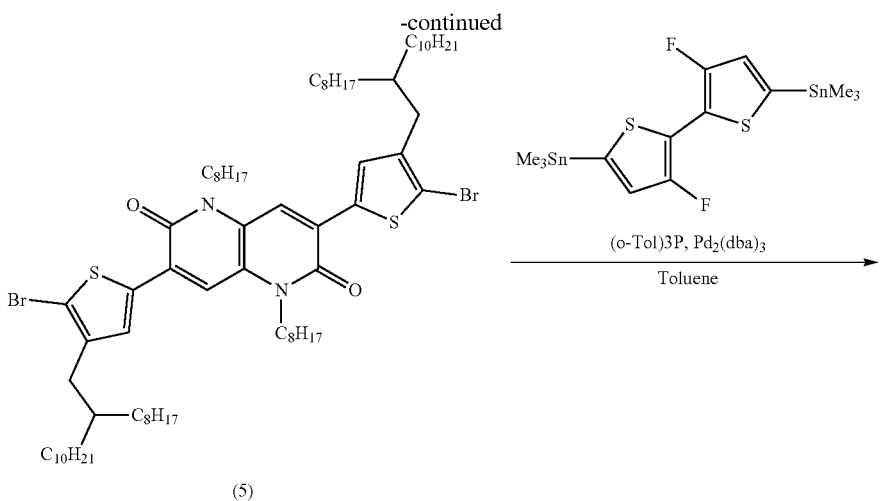

(5)

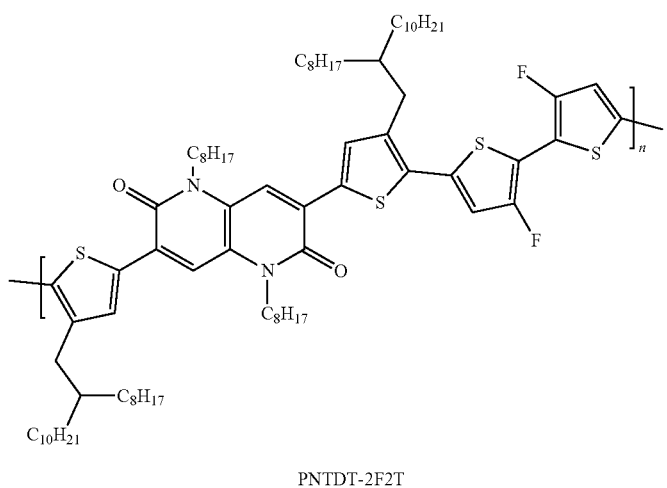

PNTDT-2F2T

Detailed Synthesis Method

Synthesis of 1,5-dihydro-1,5-naphthyridine-2,6-dione (1)

6-methoxy-1,5-naphthyridin-2(1H)-one (2.34 g, 13.28 mmol) was dissolved in 48% aqueous HBr solution (59 mL), stirred at 125° C., and left for about 2 hours. After cooling to room temperature and adjusting the PH to 7, the resulting precipitate was collected by filtration while washing with n-hexane. A beige powder was obtained (2.05 g, yield=95%) by drying under vacuum.

Synthesis of 1,5-dioctyl-1,5-naphthyridine-2,6-dione (2)

Substance 1 (1.85 g, 11.41 mmol), cesium carbonate (4.84 g, 14.85 mmol) and 1-bromooctane (3.26 mL, 18.87 mmol) were dissolved in 20 mL of dimatic sulfoxide (DMSO), stirred at 95° C., and left for 24 hours. After cooling to room temperature, the solvent was removed in vacuo and a yellow powder was obtained (0.38 g, yield=9%) by silica gel column (MC:MeOH=99:1, v/v).

Synthesis of 3,7-dibromo-1,5-dioctyl-1,5-naphthyridine-2,6-dione (3)

Substance 2 (0.26 g, 0.67 mmol) and N-bromosuccinimide (0.26 g, 1.48 mmol) were dissolved in acetic acid (AA) (20 mL), stirred at 95° C., and left for 24 hours. After cooling to room temperature, the solvent was removed in vacuo and an orange powder was obtained (0.21 g, yield=57%) by silica gel column (MC:MeOH=99:1, v/v).

Synthesis of 1,5-dioctyl-3,7-bis(4-(2-octyldodecyl)thiophen-2-yl)-1,5-dihydro-1,5-naphthyridine-2,6-dione (4)

Substance 3 (0.20 g, 0.36 mmol), tributyl(4-(2-octyldodecyl)thiophen-2-yl)stannane (0.75 g, 1.10 mmol), and Pd(PPh$_3$)$_4$ (0.025 g, 0.02 mmol) were dissolved in 15 mL of DMF, stirred at 130° C., and left for 24 hours. After cooling to room temperature, an orange powder was obtained by filtration while washing with MeOH. Flash silica column (CHCl$_3$) was followed by recrystallization from ethyl acetate to obtain an orange powder (0.30 g, yield=75%).

Synthesis of 3,7-bis(5-bromo-4-(2-octyldodecyl)thiophen-2-yl)-1,5-dioctyl-1,5-dihydro-1,5-naphthyridine-2,6-dione (5)

Substance 4 (0.30 g, 0.27 mmol) and N-bromosuccinimide (0.09 g, 0.54 mmol) were dissolved in 30 mL of CHCl$_3$, stirred at room temperature, and left for 24 hours. A red powder was obtained (0.27 g, yield=68%) by silica gel column (MC:MeOH=99:1, v/v).

Synthesis of Polymer PNTDT-2F2T

Polymer PNTDT-2F2T was polymerized via a Stille coupling reaction.

Substance 5 (0.12 g, 0.09 mmol) and 3,3'-difluoro-[2,2'-bithiophene]-5,5'-diyl)bis(trimethylstannane) (0.05 g, 0.09 mmol) were dissolved in 3 mL of toluene and then subjected to nitrogen substitution. Thereafter, P(o-tol)$_3$ (0.0025 g, 0.0083 mmol) and Pd$_2$(dba)$_3$ (0.0019 g, 0.0021 mmol) were added as catalysts, and then stirred at 100° C. for 48 hours. After cooling to room temperature, the reaction solution was slowly precipitated in 300 mL of methanol and the resulting solid was filtered off. The filtered solid was purified through soxhlet in the order of methanol, acetone, n-hexane, and CHCl$_3$. The resulting liquid was precipitated again in methanol, filtered through a filter, and dried to collect PNTDT-2F2T which is a dark green solid (0.15 g, yield=63%).

Preparation Example 2. Synthesis of Novel Polymer Having 1,5-naphthyridine-2,6-dione Structure [P(NTD4T-o-2FB)]

A novel polymer P(NTD4T-o-2FB) that acts as an electron donor compound in a photo-active layer of an organic solar cell was ultimately synthesized according to the following Synthesis Mechanism 2.

[Synthesis Mechanism 2]

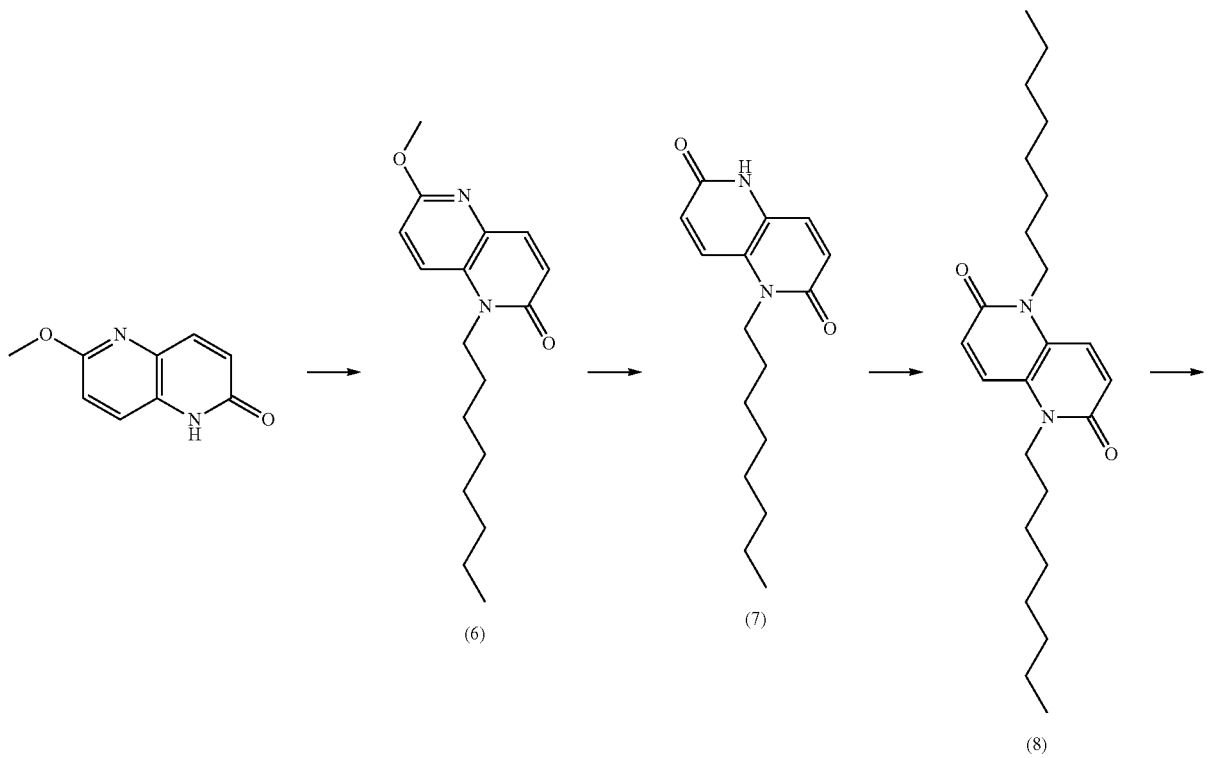

-continued
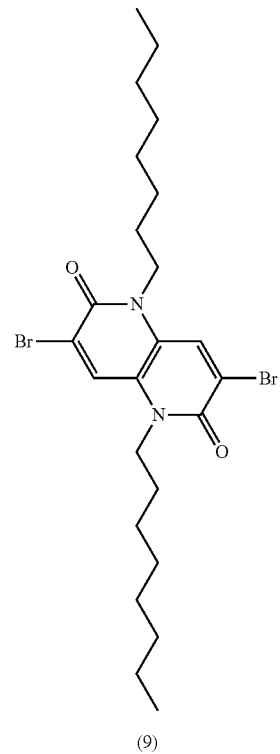
(9)
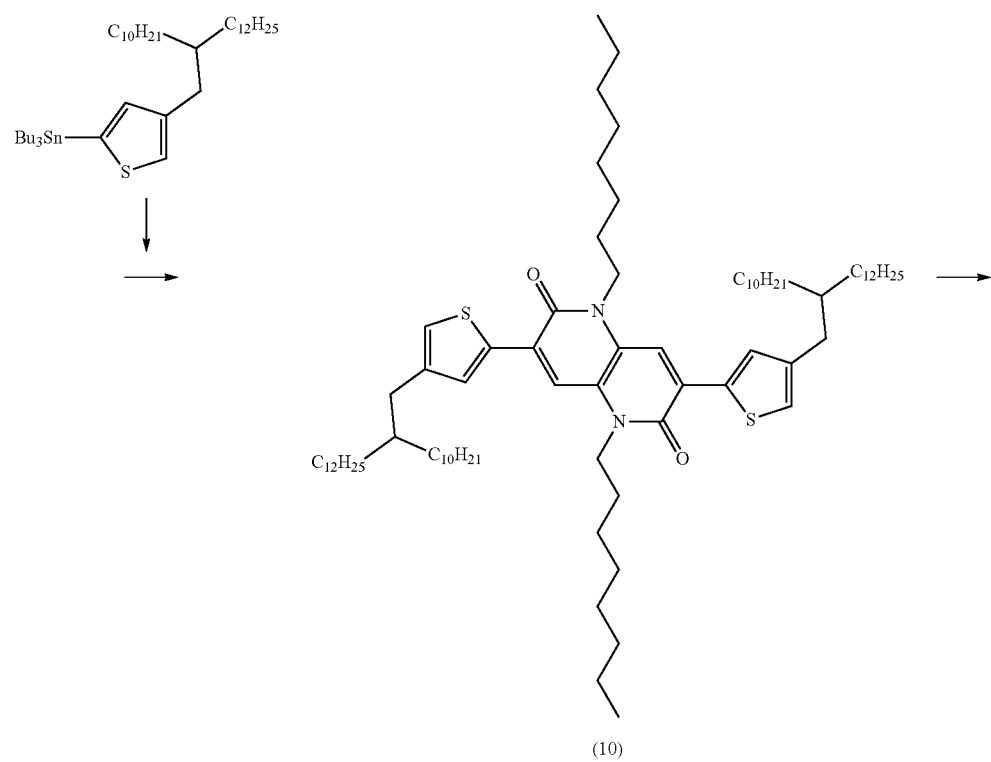
(10)

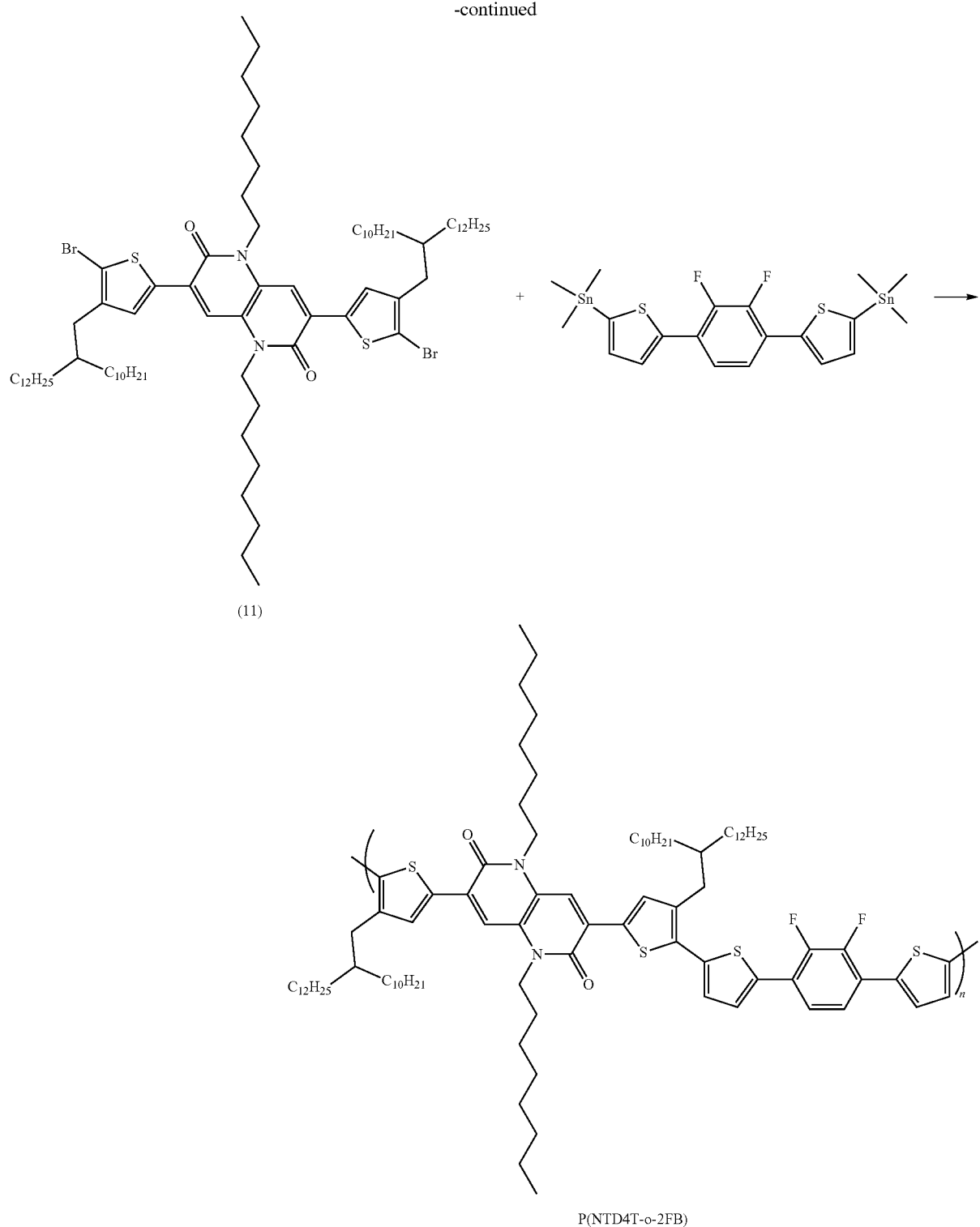

Detailed Synthesis Method

Synthesis of 6-methoxy-1-octyl-1,5-naphthyridin-2(1H)-one (6)

6-methoxy-1,5-naphthyridin-2(1H)-one (16 g, 90.8 mmol), 1-bromooctane (30 g, 154 mmol), and cesium carbonate (50 g, 154 mmol) were dissolved in 100 mL of dimethyl sulfoxide (DMSO) solvent, stirred at 60° C., and left for about 24 hours. The mixture was cooled to room temperature and the solvent was removed in vacuo. Then, a reddish brown powder was obtained (7.8 g, yield=30%) by purification with silica gel column.

Synthesis of 1-octyl-1,5-dihydro-1,5-naphthyridine-2,6-dione (7)

Substance 6 (7.8 g, 27 mmol) was dissolved in 48% aqueous HBr solution (60 mL), stirred at 80° C., and left for 4 hours. After cooling to room temperature, the precipitate was filtered while being washed with water and then dried under vacuum to obtain a yellow powder (7 g, yield=95%).

Synthesis of 1,5-dioctyl-1,5-dihydro-1,5-naphthyridine-2,6-dione (8)

Substance 7 (3.5 g, 12.7 mmol), 1-bromooctane (7.4 g, 38 mmol), and cesium carbonate (6.2 g, 19 mmol) were dissolved in 50 mL of toluene, stirred at 120° C., and left for 24 hours. After cooling to room temperature, the solvent was removed in vacuo, and a yellow powder was obtained (2 g, yield=40%) by purification with silica gel column.

Synthesis of 3,7-dibromo-1,5-dioctyl-1,5-dihydro-1,5-naphthyridine-2,6-dione (9)

Substance 8 (2 g, 5.1 mmol) and N-bromosuccinimide (2.5 g, 14.3 mmol) were dissolved in acetic acid (AA) (50 mL), stirred at 90° C., and left for 24 hours. After cooling to room temperature, the solvent was removed in vacuo and a yellow powder was obtained (1.7 g, yield=60%) by silica gel column (MC:MeOH=99:1, v/v).

Synthesis of 3,7-bis(4-(2-decyltetradecyl)thiophen-2-yl)-1,5-dioctyl-1,5-dihydro-1,5-naphthyridine-2,6-dione (10)

Substance 9 (0.2 g, 0.36 mmol), tributyl(4-(2-octyldodecyl)thiophen-2-yl)stannane (0.75 g, 1.10 mmol), and Pd(PPh$_3$)$_4$ (0.025 g, 0.02 mmol) were dissolved in 15 mL of dimethyl formaldehyde (DMF), stirred at 130° C., and left for 24 hours. After cooling to room temperature, an orange powder was obtained by filtration while washing with MeOH. The orange powder was obtained (0.30 g, yield=75%) by purification with silica gel column.

Synthesis of 3,7-bis(5-bromo-4-(2-decyltetradecyl)thiophen-2-yl)-1,5-dioctyl-1,5-dihydro-1,5-naphthyridine-2,6-dione (11)

Substance 10 (0.30 g, 0.27 mmol) and N-bromosuccinimide (0.09 g, 0.54 mmol) were dissolved in 30 mL of CHCl$_3$, stirred at room temperature, and left for 24 hours. A red powder was obtained (0.27 g, yield=68%) by silica gel column (MC:MeOH=99:1, v/v).

Synthesis of Polymer P(NTD4T-o-2FB)

Polymer P(NTD4T-o-2FB) was polymerized via a Stille coupling reaction.

Substance 6 (0.124 g, 0.09 mmol) and [(2,3'-difluoro-1,4-phenylene)bis(thiophene-5,2-diyl))bis(trimethylstannane)] (0.054 g, 0.09 mmol) were dissolved in 3 mL of toluene and then subjected to nitrogen substitution. Thereafter, P(o-tol)$_3$ (0.0025 g, 0.0083 mmol) and Pd$_2$(dba)$_3$ (0.0019 g, 0.0021 mmol) were added as catalysts and then stirred at 100° C. for 48 hours. After cooling to room temperature, the reaction solution was slowly precipitated in 300 mL of methanol (MeOH) and the resulting solid was filtered off. The filtered solid was purified through soxhlet extraction in the order of methanol, acetone, n-hexane, and CHCl$_3$. The resulting liquid was precipitated again in methanol, filtered through a filter, and dried to collect P(NTD4T-o-2FB) which is a black solid (0.121 g, yield=90%).

Preparation Example 3. Synthesis of Novel Polymer Having 1,5-naphthyridine-2,6-dione Structure [P(NTD4T-p-2FB)]

A novel polymer P(NTD4T-p-2FB) that acts as an electron donor compound in a photo-active layer of an organic solar cell was ultimately synthesized according to the following Synthesis Mechanism 3.

[Synthesis Mechanism 3]

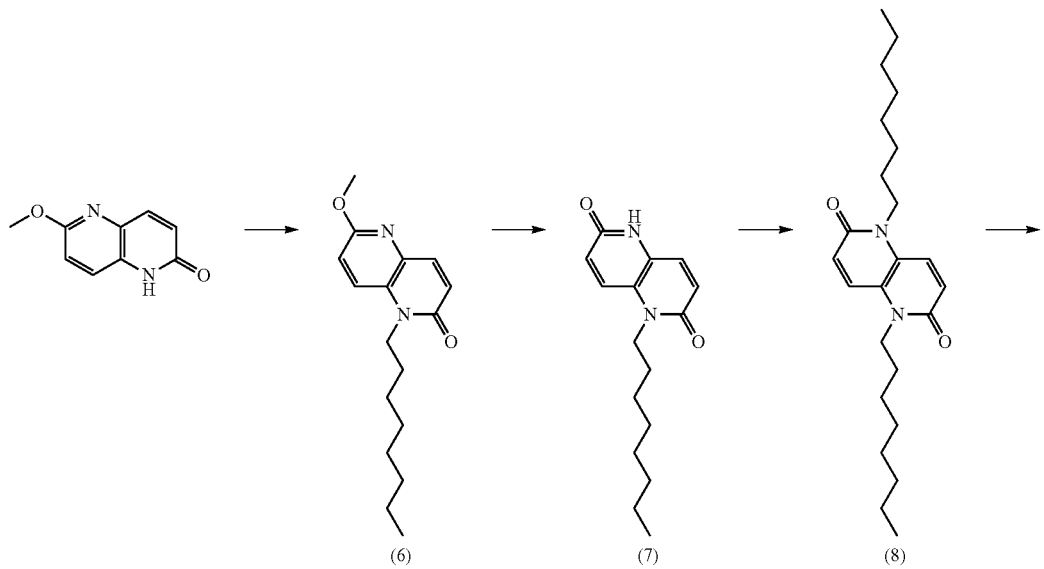

-continued
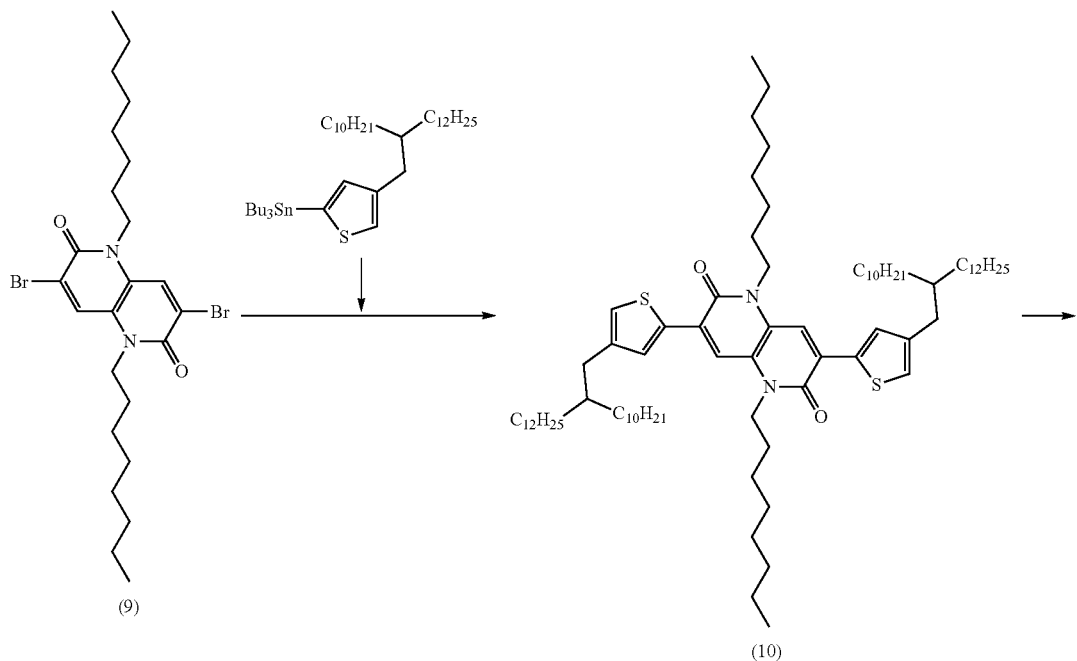
(9) → (10)
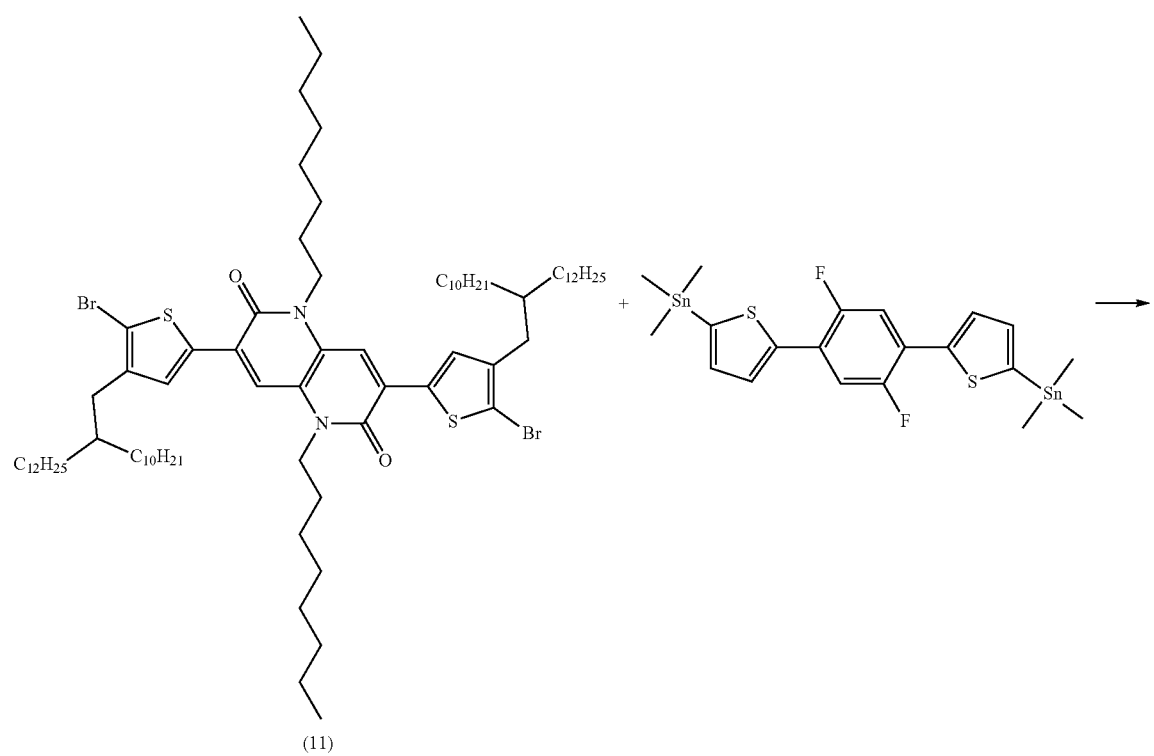
(11)

-continued

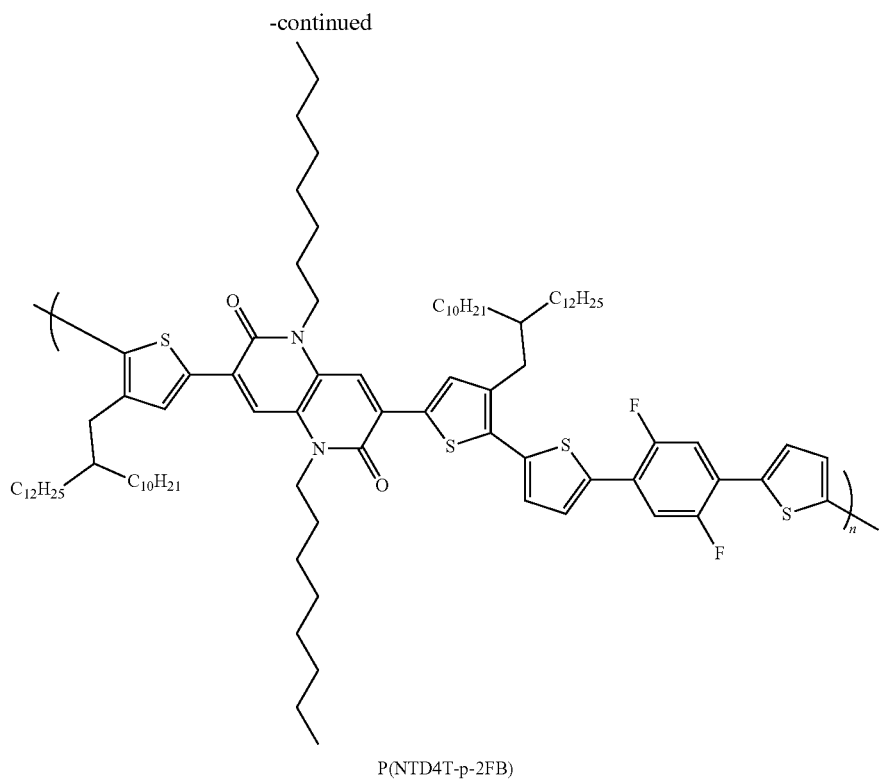

P(NTD4T-p-2FB)

Detailed Synthesis Method

Substances 6 to 11 were synthesized in the same manner as in the detailed synthesis method for "Synthesis of Novel Polymer Having 1,5-naphthyridine-2,6-dione Structure [P(NTD4T-o-2FB)] in Preparation Example 2" and ultimately a red powder of substance 11 was obtained (0.27 g, yield=68%).

Synthesis of Polymer P(NTD4T-p-2FB)

Polymer P(NTD4T-p-2FB) was polymerized via a Stille coupling reaction

Substance 11 (0.124 g, 0.09 mmol) and ((2,5'-difluoro-1,4-phenylene)bis(thiophene-5,2-diyl))bis(trimethylstannane) (0.054 g, 0.09 mmol) were dissolved in 3 mL of toluene and then subjected to nitrogen substitution. Then, P(o-tol)$_3$ (0.0025 g, 0.0083 mmol) and Pd$_2$(dba)$_3$ (0.0019 g, 0.0021 mmol) were added as catalysts and then stirred at 100° C. for 48 hours. After cooling to room temperature, the reaction solution was slowly precipitated in 300 mL of methanol (MeOH) and the resulting solid was filtered off. The filtered solid was purified through soxhlet extraction in the order of methanol, acetone, n-hexane, and CHCl$_3$. The resulting liquid was precipitated again in methanol, filtered through a filter, and dried to collect P(NTD4T-p-2FB) which is a black solid (0.125 g, yield=93%).

[Table 1] below summarizes novel polymers containing a 1,5-naphthyridine-2,6-dione structure prepared according to Preparation Examples 1 to 3 above.

TABLE 1

Preparation Example 1

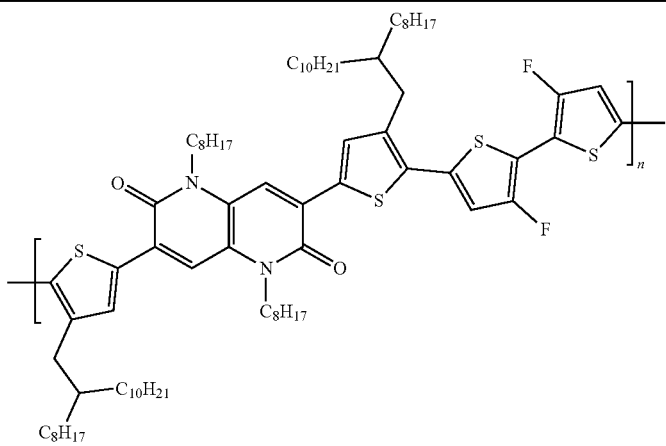

PNTDT-2F2T

TABLE 1-continued
Preparation Example 2
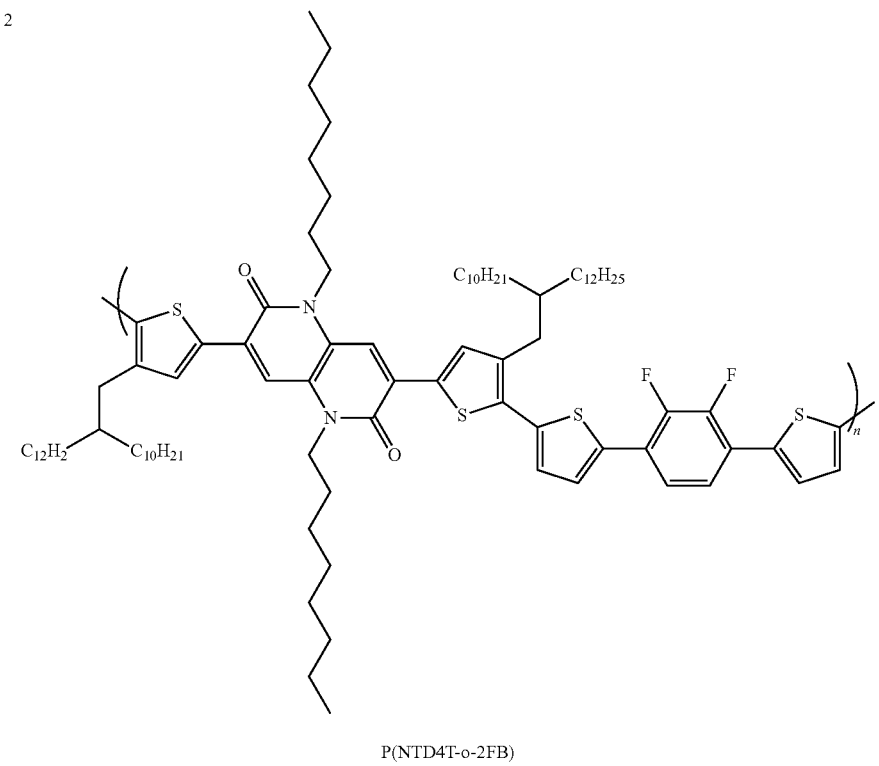
P(NTD4T-o-2FB)
Preparation Example 3
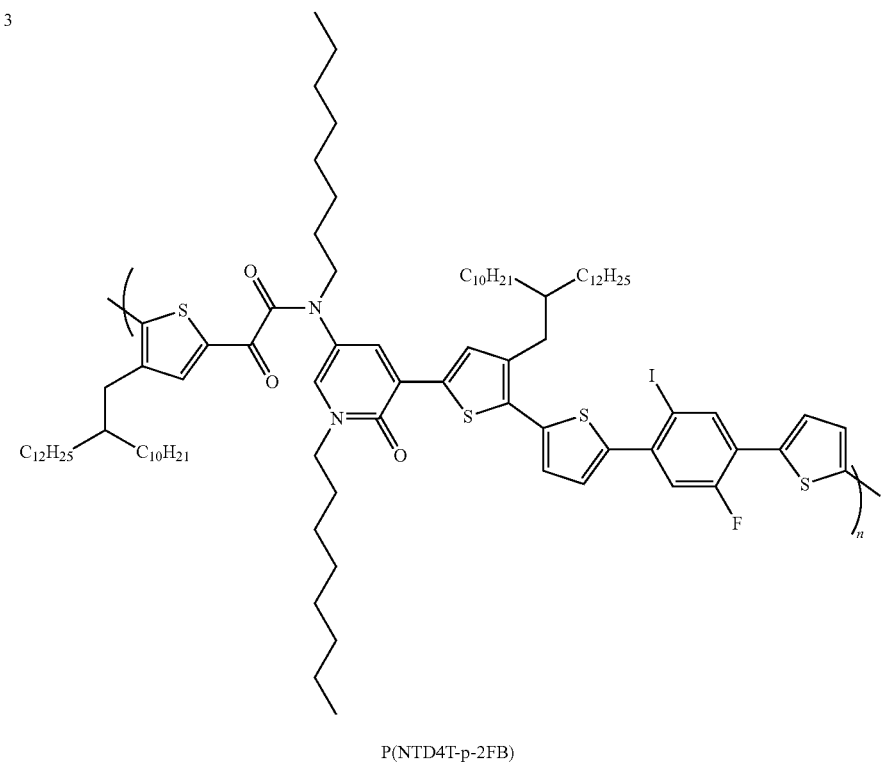
P(NTD4T-p-2FB)

Examples 1 to 3 Organic Solar Cell Fabrication
and Characteristics Evaluation

Preparation of Mixture Solution for Photo-Active Layer

As the polymer PNTDT-2F2T according to Preparation Example 1 and the acceptor material, $PC_{71}BM$ was mixed in a ratio of 1:1.5 (w/w, 18 mg/mL in total) to prepare a mixture solution.

In addition, as the polymers P(NTD4T-o-2FB) and P(NTD4T-p-2FB) according to Preparation Examples 2 and 3 above and the acceptor material, $PC_{71}BM$ was mixed in a ratio of 1:1.5 (w/w, 18 mg/mL in total) to prepare a mixture solution.

Fabrication of Organic Solar Cell

A solar cell device was fabricated with a structure of ITO/PEDOT:PSS/photo-active layer(PNTDT-2F2T: $PC_{71}BM$)/Ca/Al. First, a glass substrate on which a patterned ITO was formed was cleaned with distilled water, acetone, and isopropanol, and then subjected to UV-ozone treatment for 20 minutes. Then, a PEDOT:PSS conductive polymer solution was spin-coated to have a thickness of 30 nm to 40 nm and moisture was removed at 150° C. for 20 minutes. Thereafter, the mixture solution according to the above Preparation Example 1 was spin-coated at a rate of 1500 rpm for 60 seconds and left at room temperature for 1 hour. Lastly, a 5 nm Ca electrode and 100 nm Al electrode were deposited one after another.

In addition, a solar cell device using the mixture solutions according to the above Preparation Examples 2 and 3 was fabricated.

The solar cell device was fabricated with a structure of ITO/PEDOT:PSS/photo-active layer(PNTDT-2F2T: $PC_{71}BM$)/Ca/Al. First, a glass substrate on which a patterned ITO was formed was cleaned with distilled water, acetone, and isopropanol, and then subjected to UV-ozone treatment for 20 minutes. Then, a PEDOT:PSS conductive polymer solution was spin-coated to have a thickness of 30 nm to 40 nm and moisture was removed at 150° C. for 20 minutes. Thereafter, the mixture solutions according to the above Preparation Examples 2 and 3 were spin-coated at a rate of 1500 rpm for 60 seconds and left at room temperature for 1 hour. Lastly, a 5 nm Ca electrode and 100 nm Al electrode were deposited one after another.

The organic solar cell devices fabricated according to the above Preparation Examples 1 to 3 will be referred to as "Examples 1 to 3," respectively.

Experimental Example 1. Measurement of Light Absorption Coefficient

A light absorption coefficient of the polymer PNTDT-2F2T in accordance with Preparation Example 1 was measured in a wavelength range from 380 nm to 1000 nm, and the result is shown in FIG. 2.

As shown in FIG. 2, it can be seen that the polymer PNTDT-2F2T in accordance with Preparation Example 1 of the present invention has a light absorption coefficient of $1.60 \times 10^5$ cm$^{-1}$ at a maximum light absorption wavelength of 730 nm.

Also, a light absorption coefficient of the polymer P(NTD4T-o-2FB) in accordance with Preparation Example 2 was measured in a wavelength range from 300 nm to 1000 nm, and the result is shown in FIG. 3.

As shown in FIG. 3, it can be seen that the polymer P(NTD4T-o-2FB) in accordance with Preparation Example 2 of the present invention has a light absorption coefficient of $1.76 \times 10^5$ cm$^{-1}$ at a maximum light absorption wavelength of 676 nm.

In addition, a light absorption coefficient of the polymer P(NTD4T-p-2FB) in accordance with Preparation Example 3 was measured in a wavelength range from 300 nm to 1000 nm, and the result is shown in FIG. 4.

As shown in FIG. 4, it can be seen that the polymer P(NTD4T-p-2FB) in accordance with Preparation Example 3 of the present invention has a light absorption coefficient of $2.00 \times 10^5$ cm$^{-1}$ at a maximum light absorption wavelength of 671 nm.

Experimental Example 2. Cyclic Voltammetry Analysis Result

A cyclic voltammetry (CV) analysis was performed to measure an energy level of the polymer PNTDT-2F2T in accordance with Preparation Example 1 (shown in FIG. 5), and the HOMO energy level and the LUMO energy level of the polymer, which are obtained through the CV analysis, were stated in Table 2.

Also, a CV analysis was performed to measure an energy level of the polymer P(NTD4T-o-2FB) in accordance with Preparation Example 2 (shown in FIG. 6), and the HOMO energy level and the LUMO energy level of the polymer, which are obtained through the CV analysis, were stated in Table 2. In this case, an optical band gap energy (eV) is 1.72 eV.

In addition, a CV analysis was performed to measure an energy level of the polymer P(NTD4T-p-2FB) in accordance with Preparation Example 3 (shown in FIG. 7), and the HOMO energy level and the LUMO energy level of the polymer, which are obtained through the CV analysis, were stated in Table 2. In this case, an optical band gap energy (eV) is 1.67 eV.

TABLE 2

|  | HOMO Energy Level | LUMO Energy Level |
|---|---|---|
| Preparation Example 1 | −5.20 eV | −3.67 eV |
| Preparation Example 2 | −5.24 eV | −3.52 eV |
| Preparation Example 3 | −5.19 eV | −3.52 eV |

Experimental Example 3. Surface Morphology Analysis

A transmission electron microscopy (TEM) image was measured to analyze surface morphology of the photo-active layer of the organic solar cell in accordance with Example 1, and the result is shown in FIG. 8.

As shown in FIG. 8, a needle-like polymer crystal having a distinct needle shape in the photo-active layer may be identified.

In addition, an atomic force microscopy (AFM) image was measured to analyze surface morphology of the photo-active layer of the organic solar cell in accordance with Example 2, and the result is shown in FIG. 9.

As shown in FIG. 9, a needle-like polymer crystal having a distinct needle shape in the photo-active layer may be identified.

Also, an AFM image was measured to analyze surface morphology of the photo-active layer of the organic solar cell in accordance with Example 3, and the result is shown in FIG. 10.

As shown in FIG. 10, a needle-like polymer crystal having a distinct needle shape in the photo-active layer may be identified.

Experimental Example 4. Hole Mobility Analysis

Mobility using space charge limited current (SCLC) of the organic solar cell in accordance with Example 1 was measured, and the result is shown in FIG. 11.

As shown in FIG. 11, a hole mobility of the photo-active layer of the organic solar cell according to the present invention is $8.6 \times 10^{-3}$ $cm^2V^{-1s-1}$, which confirms excellent hole mobility.

In addition, a mobility using SCLC of the organic solar cell in accordance with Example 2 was measured, and the result was shown in FIGS. 12 and 13. The obtained hole mobility and electron mobility of the organic solar cell are shown in Table 3 below.

In addition, a mobility using SCLC of the organic solar cell in accordance with Example 3 was measured, and the result is shown in FIGS. 12 and 13. The obtained hole mobility and electron mobility of the organic solar cell are shown in Table 3 below.

As shown in FIGS. 12 and 13, the hole mobility (shown in (a) of FIG. 12) of the photo-active layer of the organic solar cell in accordance with Example 2 is $1.71 \times 10^{-3}$ $cm^2V^{-1s-1}$ and the electron mobility (shown in (a) of FIG. 13) is $3.71 \times 10^{-3}$ $cm^2V^{-1s-1}$, which confirms excellent hole mobility and electron mobility.

As shown in FIGS. 12 and 13, the hole mobility (shown in (b) of FIG. 12) of the photo-active layer of the organic solar cell in accordance with Example 3 is $2.92 \times 10^{-3}$ $cm^2V^{-1s-1}$ and the electron mobility (shown in (b) of FIG. 13) is $2.09 \times 10^{-3}$ $cm^2V^{-1s-1}$, which confirms excellent hole mobility and electron mobility.

TABLE 3

|  | Hole Mobility [$cm^2s^{-1}V^{-1}$] | Electron Mobility [$cm^2s^{-1}V^{-1}$] |
| --- | --- | --- |
| Example 1 | $8.6 \times 10^{-3}$ |  |
| Example 2 | $1.71 \times 10^{-3}$ | $3.71 \times 10^{-3}$ |
| Example 3 | $2.92 \times 10^{-3}$ | $2.09 \times 10^{-3}$ |

Experimental Example 5. Performance Evaluation of Organic Solar Cell

Current density-voltage (J-V) of the organic solar cell in accordance with Example 1 above was measured and shown in FIG. 14, and the efficiency is shown in Table 4 below.

In addition, current density-voltage (J-V) of the organic solar cell in accordance with Example 2 was measured and shown in FIG. 15, and the efficiency is shown in Table 4 below.

Also, current density-voltage (J-V) of the organic solar cell in accordance with Example 3 was measured and shown in FIG. 16, and the efficiency thereof is shown in Table 4 below.

TABLE 4

|  | Open-Circuit Voltage (V) | Short-Circuit Current ($mA/cm^2$) | Fill Factor | Maximum Efficiency (%) | Average Efficiency (%) |
| --- | --- | --- | --- | --- | --- |
| Example 1 | 0.73 | 18.79 | 0.70 | 9.62 | 9.52 |
| Example 2 | 0.805 | 16.7 | 0.674 | 9.06 | 8.99 |
| Example 3 | 0.787 | 18.3 | 0.703 | 10.1 | 9.95 |

Example 4 Perovskite Solar Cell Fabrication and Characteristics Evaluation

Preparation of Perovskite Mixture Solution

A methyl ammonium iodide ($CH_3NH_3I$) material and a lead iodide ($PbI_2$) material were prepared in a 1M mixture solution in a 1:1 molar ratio.

Preparation of Solution for Hole Transport Layer

A hole transport material PNTDT-2F2T was dissolved in 1 mL of chloroform organic solvent and stirred for 5 hours or longer.

Fabrication of Perovskite Solar Cell

A perovskite solar cell device was fabricated with a structure of ITO/electron transport layer (ZnO)/electron transport layer ($PC_{61}BM$)/perovskite layer ($CH_3NH_3PbI_3$)/hole transport layer (PNTDT-2F2T)/Au.

First, a patterned ITO glass substrate was cleaned with distilled water, acetone, and isopropanol, and then subjected to UV-ozone treatment for 20 minutes. ZnO was spin-coated on the substrate to have a thickness of 30 nm, and heat treatment was performed at 200° C. for 10 minutes. Thereafter, $PC_{61}BM$ was spin-coated as an electron transport layer to have a thickness of 50 to 60 nm, and heat treatment was performed at 70° C. for 10 minutes. Then, a perovskite solution ($CH_3NH_3PbI_3$) was spin-coated at 4000 rpm for 25 seconds, diethyl ether was dropped 10 seconds before completion, and heat treatment was performed at 65° C. for 1 minute and at 100° C. for 2 minutes after the coating was completed. Then, the polymer PNTDT-2F2T in accordance with the above Preparation Example 1 was spin-coated as the hole transport layer to have a thickness of 50 to 60 nm. Lastly, a gold (Au) electrode in a thickness of 80 nm was deposited on the hole transport layer to fabricate the perovskite solar cell device. The perovskite solar cell device using the polymer of Preparation Example 1 as the hole transport layer through the above-described method will be referred to as "Example 4."

Also, as comparative examples to Example 4 above, devices were fabricated in the same manner by using Spiro-OMeTAD represented by Formula 3, which is generally used as a material for a hole transport layer of a perovskite solar cell. Depending on the presence or absence of an additive, the devices will be referred to as "Comparative Example 1 (Spiro-OMeTAD, doping) and "Comparative Example 2 (Spiro-OMeTAD, non-doping)."

[Formula 3]

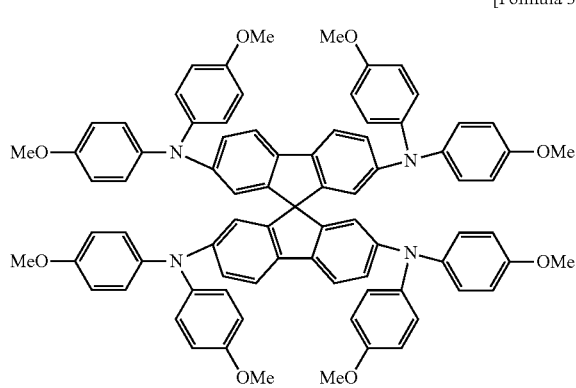

Experimental Example 6. Atmospheric Stability and Hole Transport Characteristics Analysis The device atmospheric stability of perovskite solar cells in accordance with Example 4 and Comparative Example 1 was evaluated for 20 days or longer, and the results are shown in FIG. 18. Referring to FIG. 18, it can be seen that Example 4 has better atmospheric stability than Comparative Example 1 when 20 days have elapsed.

Also, a mobility using SCLC was measured, and the results are summarized in Table 5 below. In Example 4, a hole mobility is $3.53 \times 10^{-3}$ cm$^2$ V$^{-1}$ s$^{-1}$ even without an additive, Comparative Example 1 has a hole mobility of $3.67 \times 10^{-4}$ cm$^2$ V$^{-1}$ s$^{-1}$, and Comparative Example 2 has a hole mobility of $5.75 \times 10^{-5}$ cm$^2$ V$^{-1}$ s$^{-1}$. That is, it can be seen that the hole transport layer of Example 2 of the present invention has excellent hole mobility without an additive.

TABLE 5

| | Hole Mobility |
|---|---|
| Example 4 (PNTDT-2F2T) | $3.53 \times 10^{-3}$ cm$^2$V$^{-1}$s$^{-1}$ |
| Example 1 (Spiro-OMeTAD, doping) | $3.67 \times 10^{-4}$ cm$^2$V$^{-1}$s$^{-1}$ |
| Example 2 (Spiro-OMeTAD, non-doping) | $5.75 \times 10^{-5}$ cm$^2$V$^{-1}$s$^{-1}$ |

Also, referring to FIG. 19, through the degree of PL quenching according to the materials [Example 4 (Perovskite/PNTDT-2F2T) and Comparative Example 1 (Perovskite/Spiro-OMeTAD, doping)] used for the hole transport layer of the perovskite solar cell, it can be seen that the solar cell of Example 2 according to one embodiment of the present invention provides better hole transport.

Experimental Example 7. Electrochemical Characteristics Analysis and Performance Evaluation of Perovskite Solar Cell Current density-Voltage (J-V), hysteresis characteristics, and an average photoelectric conversion efficiency were measured to evaluate the performance of the perovskite solar cells in accordance with Example 4 and Comparative Example 1 above, and the results are shown in FIGS. 20 and 21. The obtained voltage value (Voc), current density (Jsc), fill factor (FF), and photoelectric conversion efficiency of the solar cells are stated in Table 6 below.

TABLE 6

| | Open-Circuit Voltage (V) | Short-Circuit Current (mA/cm$^2$) | Fill Factor (FF) | Maximum Efficiency (%) |
|---|---|---|---|---|
| Example 4 | 1.08 | 23.62 | 0.71 | 18.11 |
| Comparative Example 1 | 1.08 | 21.52 | 0.74 | 17.26 |
| Comparative Example 2 | 1.00 | 22.40 | 0.31 | 7.03 |

Referring to FIGS. 20 and 21 and the above Table 6, it can be seen that Example 4 has better photoelectric conversion efficiency compared to Comparative Example 1.

In addition, performance evaluation of the perovskite solar cell was conducted by changing the thickness of the hole transport layer in Example 4, and the results are summarized in Table 7 below.

TABLE 7

| Hole Transport Layer (Preparation Example 1) Thickness (nm) | Open-Circuit Voltage (Voc) | Short-Circuit Current (Jsc, mA/cm$^2$) | Fill Factor (FF) | Average Efficiency (%) |
|---|---|---|---|---|
| 40~50 nm | 1.06 | 23.69 | 0.68 | 17.13 |
| 50~55 nm | 1.08 | 23.62 | 0.69 | 17.69 |
| 55~60 nm | 1.07 | 25.34 | 0.65 | 17.61 |
| 60~65 nm | 1.06 | 24.94 | 0.67 | 17.64 |
| 65~70 nm | 1.10 | 23.54 | 0.65 | 16.75 |
| 70~75 nm | 1.09 | 23.28 | 0.67 | 17.17 |
| 75~80 nm | 1.08 | 23.05 | 0.64 | 16.10 |
| 80~90 nm | 1.07 | 22.64 | 0.63 | 15.39 |
| 90~100 nm | 1.07 | 22.53 | 0.59 | 14.40 |

Referring to Table 7 above, the performance change with the change in thickness of the hole transport layer is small and high efficiency is exhibited. This may be due to the high hole mobility of the polymer PNTDT-2F2T according to the embodiment of the present invention.

Spiro-OMeTAD of Comparative Example 1 has an amorphous structure due to the spiro-core structure of the molecule. Accordingly, the hole mobility is relatively low, and the hole mobility is increased by doping other additives. The additives to be added have disadvantages in that they have strong hygroscopicity to moisture and, in some cases, are strong bases having high reactivity, so that the service life of a device is quickly reduced.

In contrast, in the case PNTDT-2F2T in accordance with Example 4 of the present invention, the hole mobility is excellent without the above additives, and thus the efficiency of the perovskite solar cell device has good efficiency, excellent atmospheric stability, and excellent service life characteristics.

Experimental Example 9. Grazing-Incidence Wide-Angle X-Ray Scattering (GIWAXS) Analysis Hereinafter, the result of analysis of grazing-incidence wide-angle X-ray scattering (GIWAXS) of polymer films in accordance with Preparation Examples 1 to 3 will be described with reference to FIGS. 22 and 23.

FIG. 22 shows a photograph showing a result of analysis of GIWAXS of a polymer according to one embodiment of the present invention. (a) of FIG. 22 is a photograph showing a GIWAXS analysis result of Preparation Example 1, and (b) and (c) of FIG. 22 are each a graph showing the GIWAXS analysis result.

Referring to FIG. 22, in the polymer of Preparation Example 1, a π-π stacking spot is observed in a direction of $q_z$ axis. This indicates that the formed polymers show face-on orientation in a film.

In addition, referring to a lamellar stacking spot in the GIWAXS analysis photograph, the polymer film of Preparation Example 1 has several regular diffraction spots in a direction of $q_z$ axis, which means that the lamellar stacking exhibits edge-on orientation and is also present over a wide area.

Meanwhile, the half-width of the π-π stacking spot has a relatively thin shape in a vertical direction ($q_z$ axis direction). When a crystalline coherence length (CCL) value is calculated using the half-width of the π-π stacking spot, a CCL value of Preparation Example 1 is 29.8 Å.

FIG. 23 is a photograph showing a GIWAXS analysis result of a polymer according to one embodiment. (a) of FIG. 23 is photograph showing a GIWAXS analysis result of Preparation Example 1, and (b) and (c) of FIG. 23 are photographs showing GIWAXS analysis results of Preparation Examples 2 and 3.

Referring to FIG. 23, in all of the polymers of Preparation Examples 1 to 3, a π-π stacking spot I is observed in a direction of $q_z$ axis. This indicates that the formed polymers show face-on orientation in the films.

In addition, when lamellar staking spots II in the GIWAXS analysis photographs are compared, the polymer film of Preparation Example 1 has several regular diffraction spots in a direction of $q_z$ axis, which means that the lamellar stacking exhibits edge-on orientation and is also present over a wide area. On the contrary, in the case of Preparation Examples 2 and 3, diffraction spots are observed in both $q_z$ axis direction and $q_y$ axis direction, and unlike the polymer of Preparation Example 1, there are not several regular diffraction spots. This means that the lamellar stacking has both edge-on orientation and face-on orientation and the lamellar stacking is formed over a small area as compared to the polymer of Preparation Example 1, and, that is, a crystal size is relatively smaller.

In the meantime, it can be seen that the half-width of the π-π stacking spot I has a different shape when Preparation Examples 1 to 3 are compared. In Preparation Example 1, the π-π stacking spot is relatively thin in the vertical direction ($q_z$ axis direction), whereas the π-π stacking spots of Preparation Examples 2 and 3 are relatively thick in the vertical direction (($q_z$ axis direction).

When a CCL value is calculated using the half-width of the π-π stacking spot, the CCL value of Preparation Example 1 is 29.8 Å and the CCL values of Preparation Examples 2 and 3 are 19.5 Å and 22.0 Å, respectively. That is, compared to Preparation Example 1, it can be seen that the polymer films of Preparation Examples 2 and 3 have smaller crystal sizes due to π-π stacking.

As a result of analysis of GIWAXS of FIG. 23, it can be seen that the polymers of Preparation Examples 1 to 3 have small crystal sizes. The smaller the crystal of polymer included in a photo-active layer, the wider the interface. Holes and electrons are produced at the interface of crystal grains, and as they move, current is generated. The larger the interface, the more current flows. That is, the polymers of Preparation Examples 1 to 3 may generate a large amount of current in the photo-active layer.

As described above, referring to Examples 1 to 3 and Experimental Examples 1 to 9, the polymer represented by Structural Formula 1 or 2 above is used in a photo-active layer of an organic solar cell or in a hole transport layer of a perovskite solar cell, has high charge mobility, and has an energy level suitable for the use as an electron donor in the photo-active layer of the organic solar cell. That is, the solar cell using the novel polymer according to the embodiment of the present invention may have excellent light conversion efficiency.

The invention claimed is:

1. A perovskite solar cell comprising:
a first electrode and a second electrode disposed facing each other; and
an electron transport layer, a perovskite layer, and a hole transport layer which are stacked between the first electrode and the second electrode,
wherein the hole transport layer comprises a polymer for a hole transport layer of a perovskite solar cell which is represented by the following Structural Formula 1:

[Structural Formula 1]

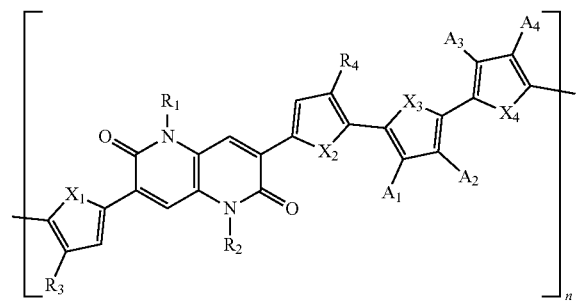

wherein in Structural Formula 1,
$X_1$, $X_2$, $X_3$ and $X_4$ are each independently O, S, Se, NH, or NR',
$R_1$, $R_2$, $R_3$ and $R_4$ are each independently an alkyl group having 1 to 50 carbon atoms, an aryl group having 6 to 50 carbon atoms, or —COOR',
$A_1$, $A_2$, $A_3$, and $A_4$ are each independently H, F, CN, or —COOR',
R' is an alkyl group having 1 to 50 carbon atoms or an aryl group having 6 to 50 carbon atoms, and
n is an integer ranging from 1 to 1000,
wherein the polymer for a hole transport layer has a crystalline coherence length (CCL) in the range of 25 Å to 30 Å.

2. The perovskite solar cell of claim 1, wherein the first electrode is a transparent electrode and the second electrode is a metal electrode, and
wherein the perovskite solar cell further includes a substrate positioned on a surface of the first electrode opposite to a surface on which the perovskite layer is present.

3. The perovskite solar cell of claim 1, wherein the electron transport layer includes titanium oxide ($TiO_2$), sol-gel tin oxide ($SnO_2$), sol-gel zinc oxide (ZnO), nanoparticle tin oxide (NP—$SnO_2$), nanoparticle zinc oxide (NP—ZnO), fullerene, fullerene derivatives, carbon nanotubes, carbon nanotube derivatives, bathocuproine, non-fullerene organic semiconductor electron acceptor compounds, and a composite layer in a metal oxide/organic semiconductor electron acceptor form.

4. The perovskite solar cell of claim 1, wherein a light conversion efficiency (%) is 14% or more.

* * * * *